(12) United States Patent
Numata

(10) Patent No.: US 10,070,078 B2
(45) Date of Patent: Sep. 4, 2018

(54) SOLID-STATE IMAGE SENSOR WITH PIXELS HAVING IN-PIXEL MEMORIES, MOTION INFORMATION ACQUISITION APPARATUS, AND IMAGING APPARATUS

(71) Applicant: CANON KABUSHIKI KAISHA, Tokyo (JP)

(72) Inventor: Aihiko Numata, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/111,250

(22) PCT Filed: Jan. 21, 2015

(86) PCT No.: PCT/JP2015/000269
§ 371 (c)(1),
(2) Date: Jul. 13, 2016

(87) PCT Pub. No.: WO2015/115067
PCT Pub. Date: Aug. 6, 2015

(65) Prior Publication Data
US 2016/0337604 A1    Nov. 17, 2016

(30) Foreign Application Priority Data

Jan. 28, 2014  (JP) ................................. 2014-013377
Sep. 16, 2014  (JP) ................................. 2014-187752
Sep. 16, 2014  (JP) ................................. 2014-187753

(51) Int. Cl.
*H04N 5/232*    (2006.01)
*H04N 5/353*    (2011.01)
(Continued)

(52) U.S. Cl.
CPC ......... *H04N 5/3532* (2013.01); *H04N 5/2329* (2013.01); *H04N 5/3456* (2013.01);
(Continued)

(58) Field of Classification Search
None
See application file for complete search history.

(56) References Cited

U.S. PATENT DOCUMENTS 7,978,221 B2    7/2011 Hiraga et al.
9,040,888 B2    5/2015 Numata
(Continued)

FOREIGN PATENT DOCUMENTS

| EP | 2 086 223 A2 | 8/2009 |
|---|---|---|
| JP | 2009-182527 A | 8/2009 |
| WO | 2010/141056 A1 | 12/2010 |

OTHER PUBLICATIONS

International Search Report and Written Opinion issued in International Application No. PCT/JP2015/000269 dated Mar. 18, 2015.
(Continued)

*Primary Examiner* — Justin P. Misleh
(74) *Attorney, Agent, or Firm* — Fitzpatrick, Cella, Harper & Scinto

(57) ABSTRACT

A solid-state image sensor acquires signals through sequential reading, in signal lines disposed along a column direction, of signals from pixels disposed in the form of a matrix. The solid-state image sensor has a plurality of first pixels that are disposed in the form of a matrix in the solid-state image sensor; and a plurality of second pixels having an in-pixel memory and disposed in the form of a matrix in columns different from those of the plurality of first pixels in the solid-state image sensor. A difference in exposure timings of the second pixels between adjacent rows is caused to be different from that of the first pixels between adjacent rows, through reading of signals from the plurality of second pixels after holding in the in-pixel memories for a predetermined charge retention time.

12 Claims, 23 Drawing Sheets

(51) Int. Cl.
*H04N 5/369* (2011.01)
*H04N 5/345* (2011.01)
*H04N 5/3745* (2011.01)
*H04N 5/355* (2011.01)
*G02B 7/34* (2006.01)
*H04N 5/357* (2011.01)
*H04N 5/361* (2011.01)
*H01L 27/146* (2006.01)

(52) U.S. Cl.
CPC ............ *H04N 5/3696* (2013.01); *G02B 7/34* (2013.01); *H01L 27/14623* (2013.01); *H01L 27/14629* (2013.01); *H01L 27/14641* (2013.01); *H01L 27/14643* (2013.01); *H04N 5/23245* (2013.01); *H04N 5/3575* (2013.01); *H04N 5/35554* (2013.01); *H04N 5/35563* (2013.01); *H04N 5/361* (2013.01); *H04N 5/3745* (2013.01); *H04N 5/37452* (2013.01)

(56) References Cited

U.S. PATENT DOCUMENTS

| | | | |
|---|---|---|---|
| 9,160,942 B2 | 10/2015 | Numata | |
| 9,307,170 B2 | 4/2016 | Numata | |
| 9,319,607 B2 | 4/2016 | Numata | |
| 9,402,041 B2 | 7/2016 | Numata | |
| 2008/0049133 A1* | 2/2008 | Bock | H04N 5/243 348/317 |
| 2008/0129834 A1* | 6/2008 | Dosluoglu | H04N 5/353 348/222.1 |
| 2008/0180547 A1 | 7/2008 | Hirose | |
| 2008/0278610 A1* | 11/2008 | Boettiger | H04N 5/2253 348/273 |
| 2009/0190013 A1* | 7/2009 | Hiraga | H04N 5/23232 348/296 |
| 2010/0309340 A1* | 12/2010 | Border | H04N 5/335 348/241 |
| 2012/0249817 A1 | 10/2012 | Ishii | |
| 2013/0021521 A1* | 1/2013 | Hamada | H04N 5/23212 348/360 |
| 2015/0296159 A1* | 10/2015 | Mansoorian | H04N 5/3532 348/308 |

OTHER PUBLICATIONS

Aihiko Numata, U.S. Appl. No. 15/111,242, filed Jul. 13, 2016.
Aihiko Numata, U.S. Appl. No. 15/215,832, filed Jul. 21, 2016.
International Preliminary Report on Patentability issued in International Application No. PCT/JP2015/000269 dated Aug. 11, 2016.

* cited by examiner

FIG. 3A
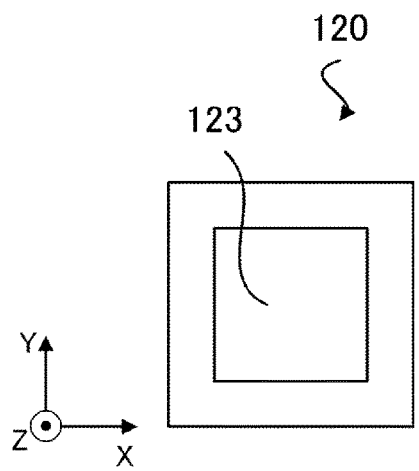
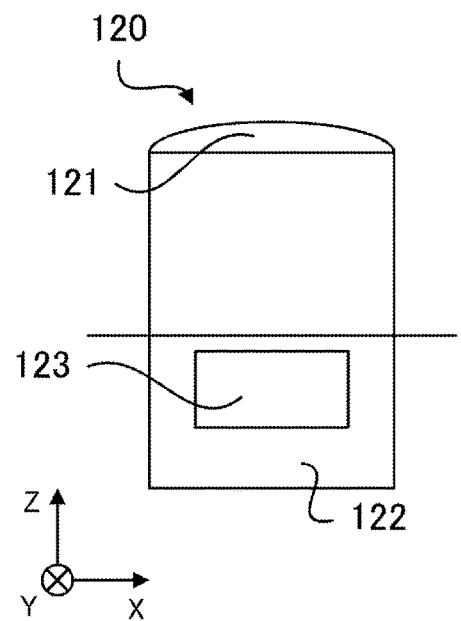
FIG. 3B
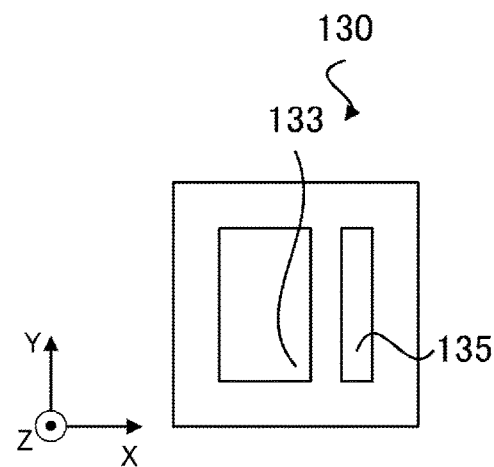
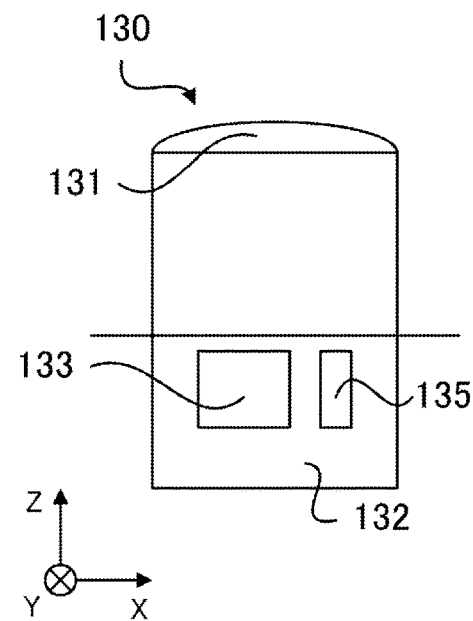

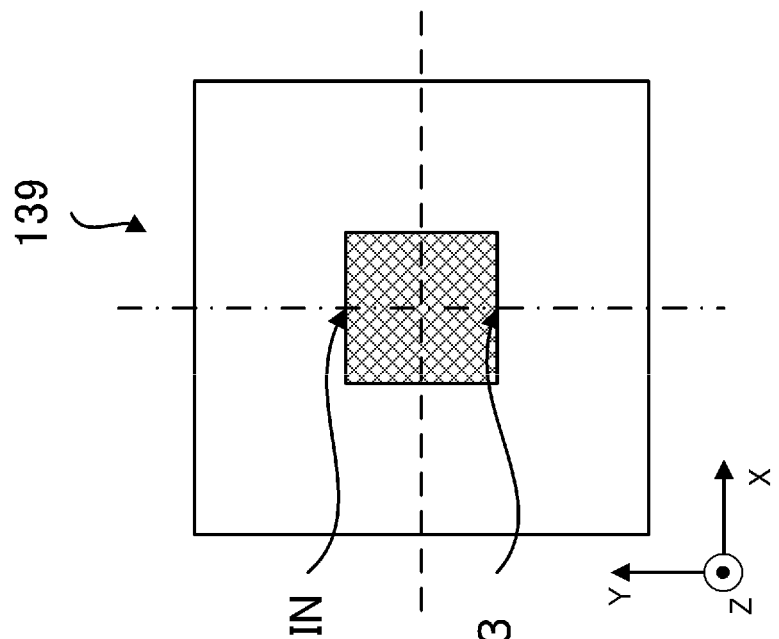
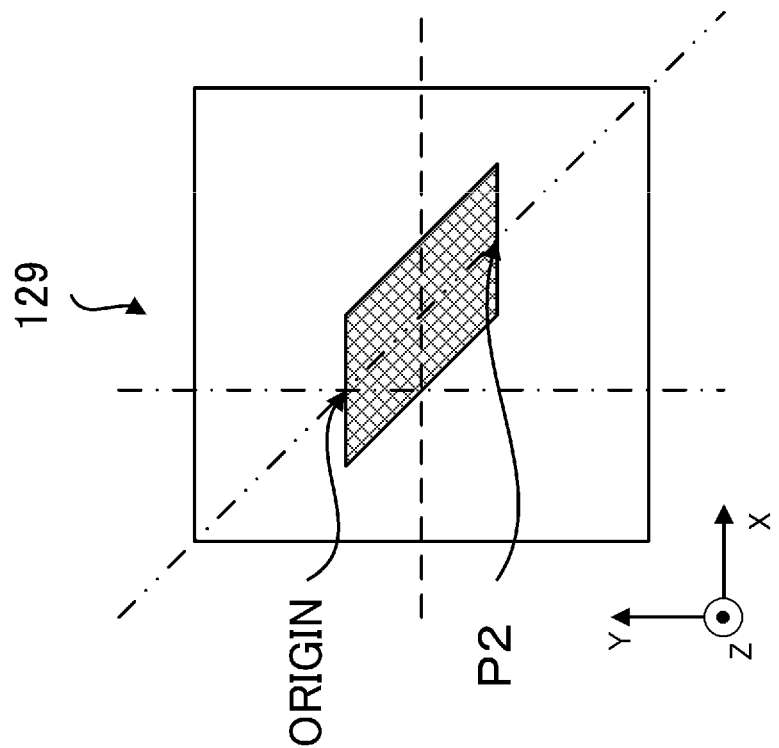

FIG. 11
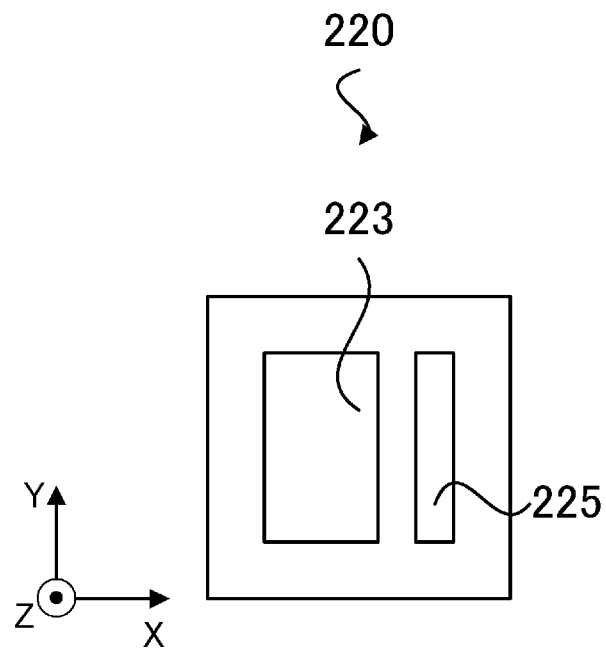
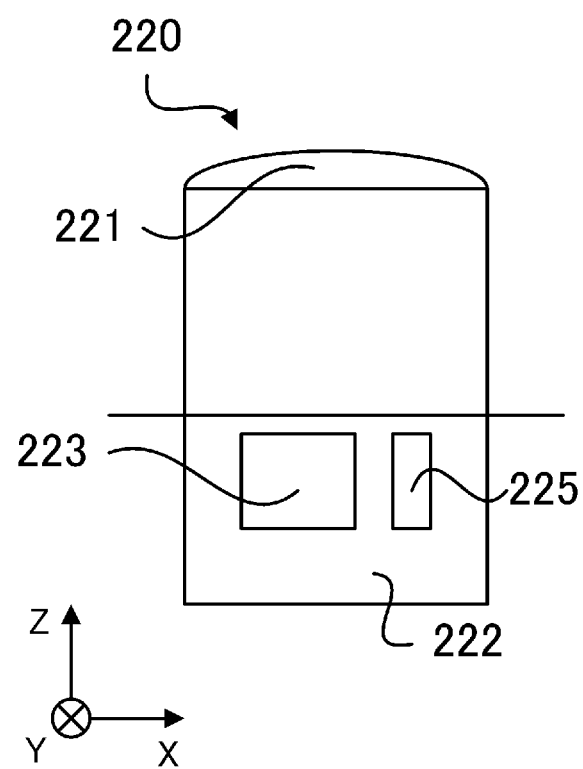

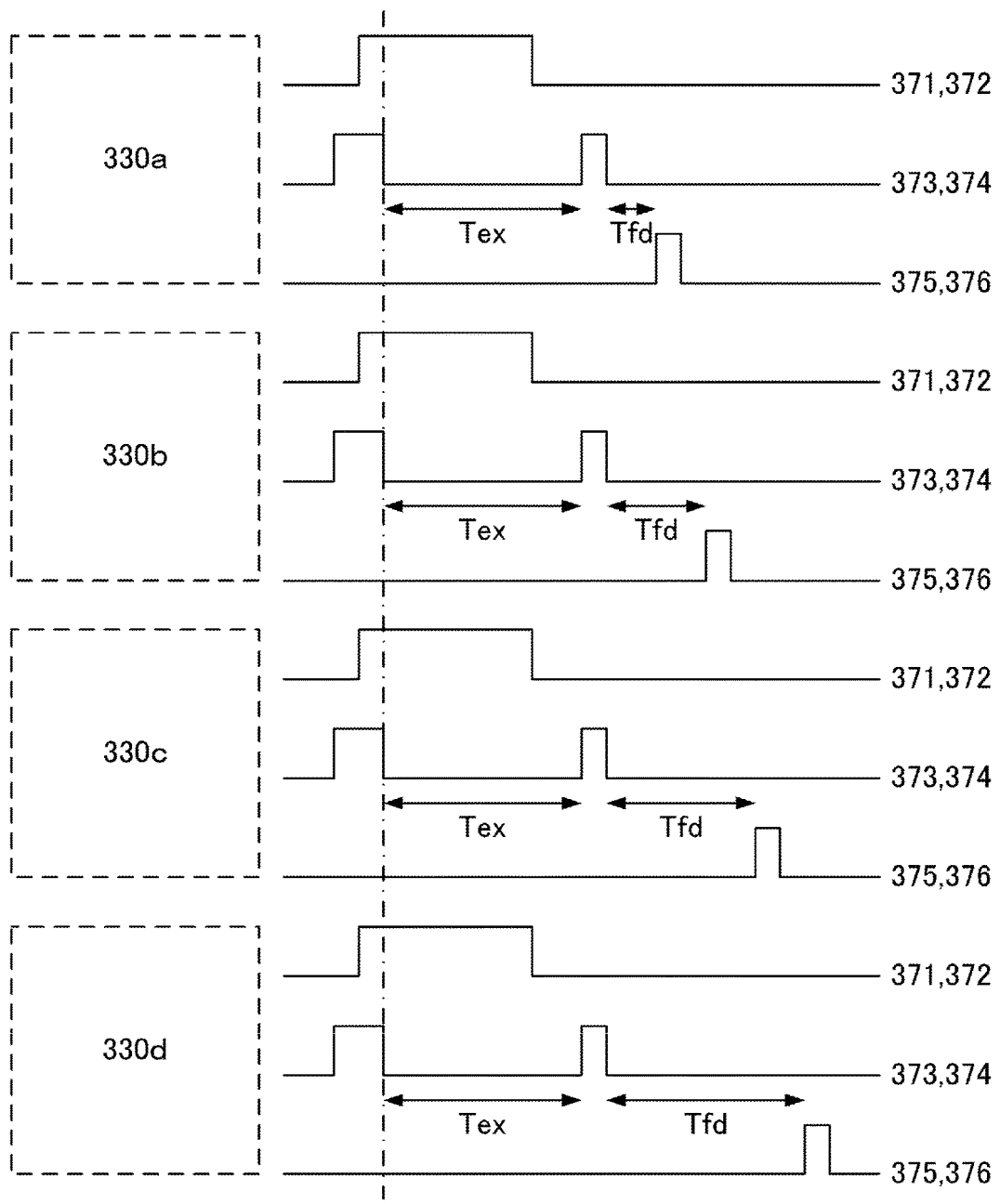

FIG. 19A
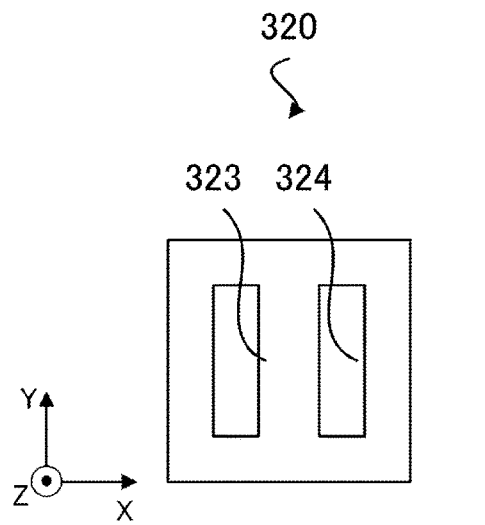
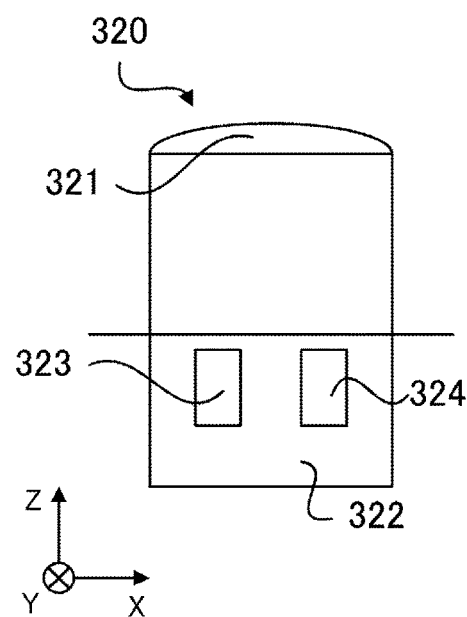
FIG. 19B
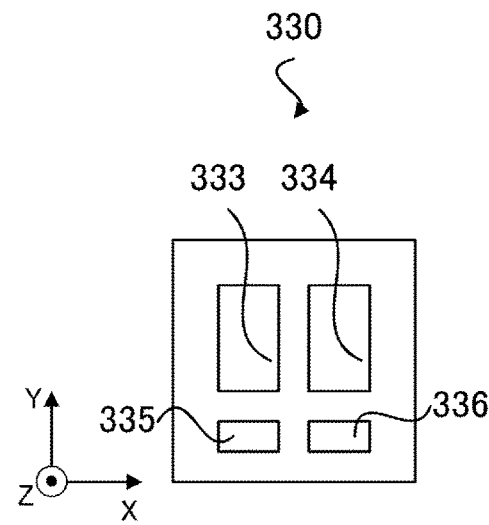
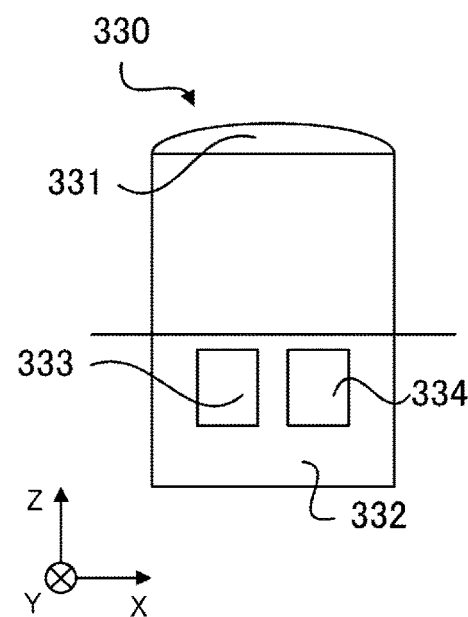

FIG. 20A
FIG. 20B
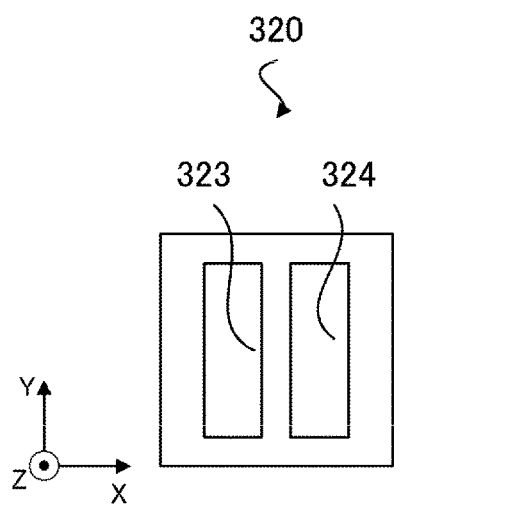
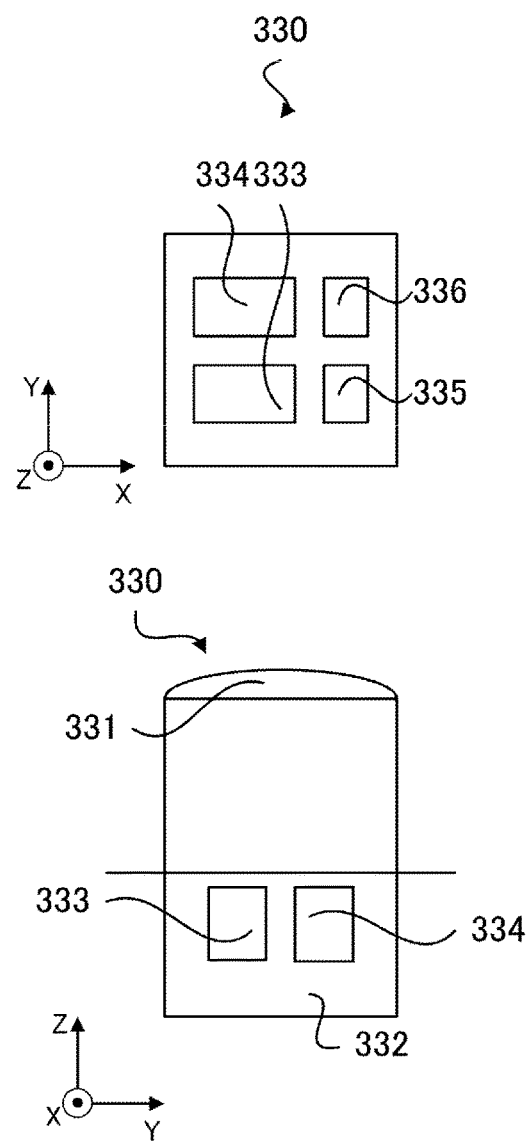

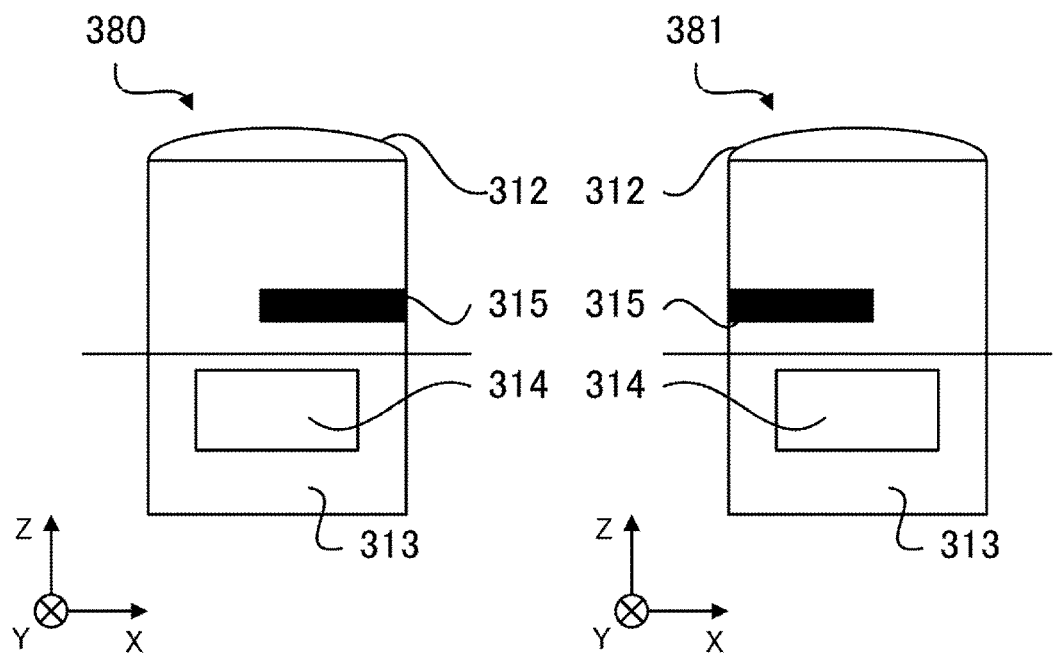
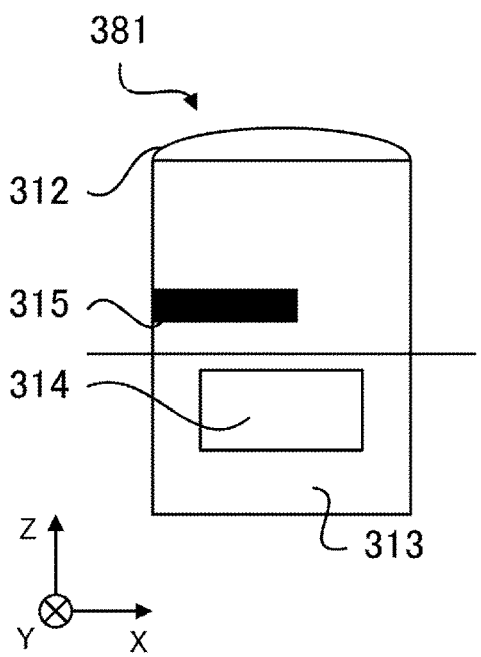
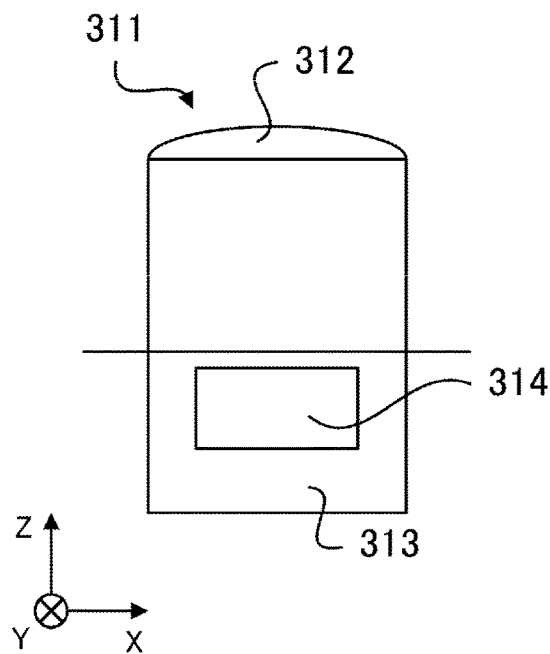

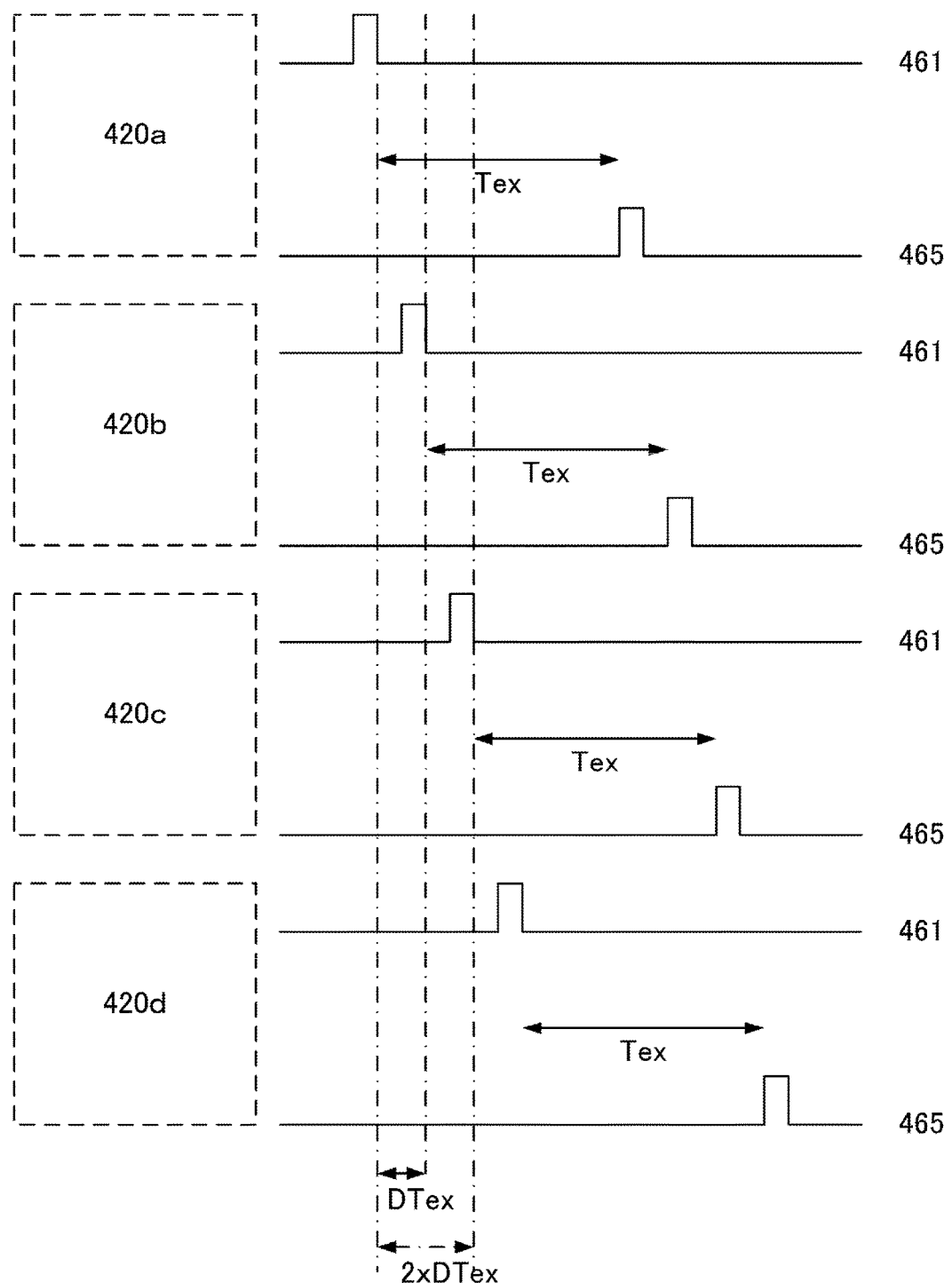

SOLID-STATE IMAGE SENSOR WITH PIXELS HAVING IN-PIXEL MEMORIES, MOTION INFORMATION ACQUISITION APPARATUS, AND IMAGING APPARATUS

TECHNICAL FIELD

The present invention relates to a solid-state image sensor, and more particularly, relates to a solid-state image sensor that is used in subject motion information acquisition in imaging apparatuses such as digital still cameras and digital video cameras.

BACKGROUND ART

In recent years, solid-state image sensors of CMOS type in which MOS transistors are utilized in pixel amplifier sections have come to be widely used in digital still cameras and video cameras. Signal transfer methods in CMOS-type solid-state image sensors include two known methods, as follows. The first method is a so-called rolling shutter scheme that involves transferring voltage signals of pixels to a vertical signal line, sequentially for each row. In such a rolling shutter scheme, the timings of signal transfer are offset for each row, and hence the exposure timings are likewise offset for each row. The second method is a so-called global shutter scheme that involves holding charge temporarily in in-pixel memories, to render simultaneous thereby the exposure timings of all pixels. Distortion-free images can be acquired, also of a subject that is moving at high speed, by utilizing a global shutter scheme.

Patent literature 1 discloses a technique for acquiring subject motion information by using a solid-state image sensor that performs signal transfer according to a rolling shutter scheme. The solid-state image sensor described in Patent literature 1 acquires subject motion information by comparing a standard image, with skipping in the row direction, and a comparative image in which signals of all rows are acquired, without skipping. Specifically, subject motion information is acquired, by comparing a standard image and a comparative image, exploiting the feature whereby comparative images exhibit a greater distortion amount in images generated with rolling shutter than is the case in standard images.

CITATION LIST

Patent Literature

[PTL 1]
Japanese Patent Application Publication No. 2009-182527

SUMMARY OF INVENTION

Technical Problem

When using the technique described in Patent literature 1, however, precision in the acquired motion information drops on account of positional offset of the image between frames, in particular when the subject is moving at high speed, since the frames in which the standard image is acquired and the frames in which the comparative image is acquired are different.

It is an object of the present invention to provide a solid-state image sensor that allows acquiring high-precision subject motion information, in particular also when a subject is moving at high speed, and to provide a motion acquisition device that uses the solid-state image sensor.

Solution to Problem

A solid-state image sensor according to a first aspect of the present invention is a solid-state image sensor that acquires signals through sequential reading, in signal lines disposed along a column direction, of signals from a plurality of pixels disposed in the form of a matrix, the solid-state image sensor having: a plurality of first pixels that are disposed in the form of a matrix in the solid-state image sensor; and a plurality of second pixels having an in-pixel memory and disposed in the form of a matrix in columns different from those of the plurality of first pixels in the solid-state image sensor, wherein a difference in exposure timings of the second pixels between adjacent rows is caused to be different from a difference in exposure timings of the first pixels between adjacent rows, through reading of signals from the plurality of second pixels after holding in the in-pixel memories for a predetermined charge retention time.

A solid-state image sensor according to a second aspect of the present invention is a solid-state image sensor that acquires signals by sequentially reading, in signal lines disposed along a column direction, signals from a plurality of pixels disposed in the form of a matrix, the solid-state image sensor having: a plurality of first pixels that are disposed in the form of a matrix in the solid-state image sensor; and a plurality of second pixels disposed in the form of a matrix in columns different from those of the plurality of first pixels in the solid-state image sensor; the solid-state image sensor being configured in such a manner that signals are read from the first pixels and the second pixels by skipping a predetermined number of rows; such that the number of skip rows of the plurality of second pixels is greater than the number of skip rows of the plurality of first pixels.

Advantageous Effects of Invention

The present invention allows acquiring high-precision subject motion information even when the subject is moving at high speed.

Further features of the present invention will become apparent from the following description of exemplary embodiments with reference to the attached drawings.

BRIEF DESCRIPTION OF DRAWINGS

FIGS. 3A, 3B illustrate pixels in a solid-state image sensor described in Embodiment 1.

FIGS. 4A, 4B illustrate images acquired with rolling shutter and global shutter.

FIG. 11 illustrates a first pixel of a solid-state image sensor described in Embodiment 2.

FIG. 18 illustrates an operation flow of second pixels in a solid-state image sensor described in Embodiment 3.

FIGS. 19A, 19B illustrate variations of pixels in a solid-state image sensor described in Embodiment 3.

FIGS. 20A, 20B illustrate variations of pixels in a solid-state image sensor described in Embodiment 3.

FIGS. 21A to 21C illustrate variations of pixels in a solid-state image sensor described in Embodiment 3.

FIG. 22 illustrates an operation flow of first pixels in a solid-state image sensor described in Embodiment 4.

DESCRIPTION OF EMBODIMENTS

A solid-state image sensor of an embodiment of the present invention will be explained next with reference to accompanying drawings. In all drawings, elements having identical functions are denoted by the same reference symbols, and a recurrent explanation thereof will be omitted.

Embodiment 1

<Motion Information Acquisition Apparatus>

Figure 1:
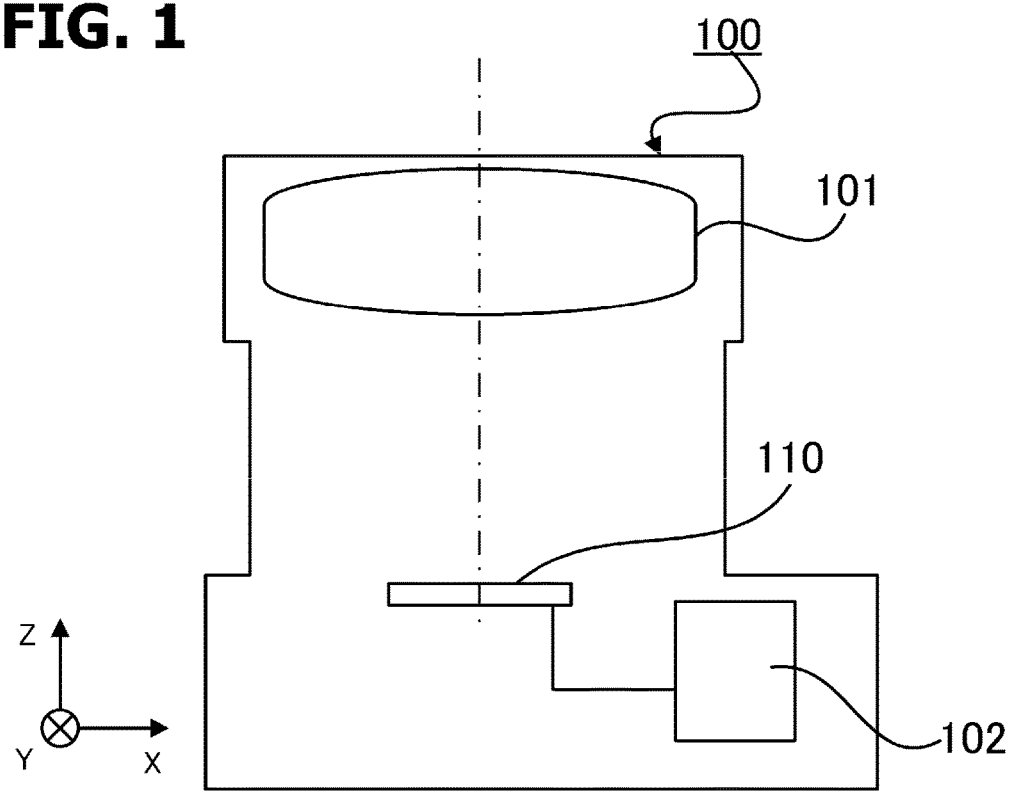
FIG. 1 illustrates a motion information acquisition apparatus that uses a solid-state image sensor described in Embodiment 1.

FIG. 1 is a schematic diagram of a motion information acquisition apparatus that uses a solid-state image sensor of the present embodiment. In FIG. 1, a motion information acquisition apparatus 100 comprises an imaging optical system 101, a solid-state image sensor 110 and a processing unit 102. The solid-state image sensor 110 is disposed on the optical axis of the imaging optical system 101, such that the imaging optical system 101 forms a subject image on the solid-state image sensor 110.

The processing unit 102 comprises a CPU, a DSP and a memory that stores a program, and detects subject motion information and acquires subject images through execution of the program. The imaging apparatus is made up of the motion information acquisition apparatus and an imaging function (subject image acquisition unit) of the processing unit 102. Known techniques can be utilized in the subject image acquisition function of the processing unit 102, and will therefore not be explained in detail in the present description.

<Solid-State Image Sensor>

Figure 2:
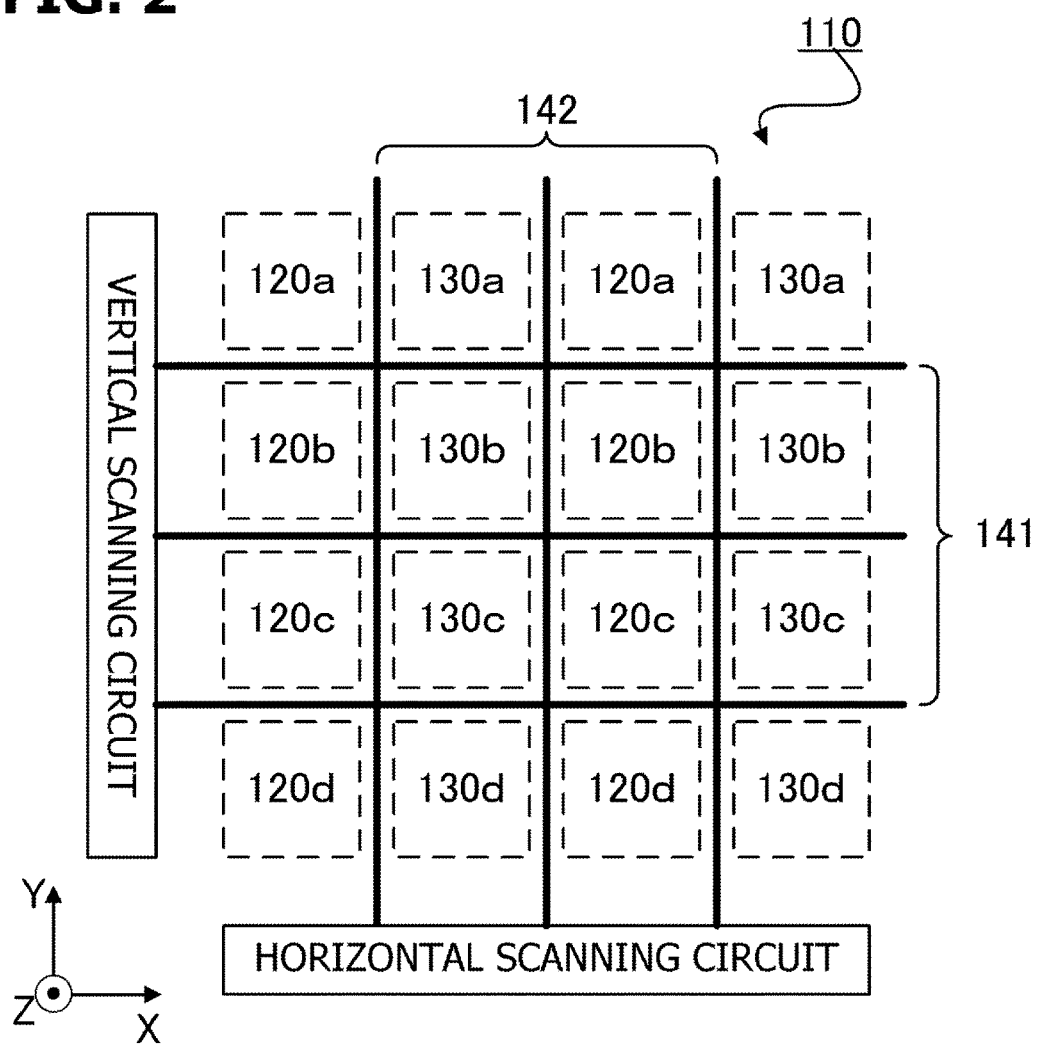
FIG. 2 illustrates a solid-state image sensor described in Embodiment 1.

FIG. 2 is a schematic diagram illustrating the solid-state image sensor 110 in the motion information acquisition apparatus of the present invention. The solid-state image sensor 110 has first pixels 120 and second pixels 130, disposed as a plurality thereof in the form of a matrix, and a peripheral circuit for reading signals from the pixels 120, 130. For simplicity, FIG. 2 illustrates an instance of 4×4 pixels, but the number of pixels is not limited thereto.

The peripheral circuit has connected horizontal driving lines 141 for driving transistors, and vertical signal lines 142 that read signals from the pixels. The pixels, which are driven by respective horizontal driving lines 141, output signals to the vertical signal lines 142.

The first pixels 120 and the second pixels 130 are disposed in alternately different columns. As illustrated in FIG. 2, the pixels are referred to as pixels 120 (130)$a$, pixels 120 (130)$b$, pixels 120 (130)$c$ and pixels 120 (130)$d$, in accordance with the row in which the pixels 120 (130) are disposed.

<Pixels>

FIG. 3($a$) is a schematic diagram illustrating a pixel internal configuration of the pixels 120, and FIG. 3($b$) is a schematic diagram illustrating the pixel internal configuration of the pixels 130. The pixels 120 (130) each have a micro-lens 121 (131) and a substrate 122 (132), from the light incidence side. A photoelectric conversion unit 123 (133) for converting to charge the light that strikes the pixel is provided inside the substrate 122 (132). The micro-lens 121 (131) is formed of $SiO_2$, SiN, or the like, which are transparent materials at the detection wavelength band. The substrate 122 (132) is formed of a material such as Si or an organic semiconductor that exhibits absorption at the detection wavelength band. Wiring is formed of a metal such as Al or Cu.

An in-pixel memory 135 formed by ion implantation or the like is provided in each of the pixels 130, such that pixel signals are acquired with global shutter, through temporary holding of charge in the in-pixel memory. In the pixels 120, by contrast, pixel signals are acquired according to rolling shutter. The aperture ratio of the photoelectric conversion unit 123 in the pixels 120 is greater than the aperture ratio of the photoelectric conversion unit 133 in the pixels 130 by the extent that the in-pixel memory 135 is absent in the photoelectric conversion unit 123. In FIG. 3($b$), an example is illustrated wherein the in-pixel memory 135 is disposed at a position offset in the X direction with respect to the photoelectric conversion unit 133, but the in-pixel memory 135 may be disposed at a position offset in the Y direction, or may be disposed at a position offset in an oblique direction.

<Motion Information Acquisition>

In the solid-state image sensor 110, pixel signals by rolling shutter are acquired using the first pixels 120, and pixel signals by global shutter are acquired using the second pixels 130. Subject motion information is acquired by comparing a distortion amount of an image of a subject image acquired in the pixels 120 and an image of the subject image acquired in the pixels 130. In the motion information acquisition apparatus of the present invention, specifically, there is acquired a plurality of subject images having different distortion amounts, such that motion information is acquired on the basis of differences in the distortion amounts. Accordingly, it becomes possible to acquire high-precision subject motion information even when the subject is moving at high speed. This will be explained below.

<Causes of Image Distortion>

An explanation follows first on differences in images acquired with rolling shutter and images acquired with global shutter. FIG. 4($a$) and FIG. 4($b$) are diagrams for explaining an image that is acquired in the case of a square subject that is moving at high speed towards the X direction. FIG. 4($a$) is an image acquired with rolling shutter, and FIG.

4(b) is an image acquired with global shutter. When rolling shutter is resorted to, there is an offset in the exposure timings between different rows, and as a result the image is acquired as a line image where the sides of the square in the Y direction (column direction) extend obliquely. By contrast, the exposure timings between pixels along the X direction (row direction) are simultaneous, and hence the image is acquired in the form of a line image where the sides in the row direction extend in the row direction. When global shutter is resorted to, the exposure timings of all pixels are simultaneous, and accordingly a square image is acquired that reflects the shape of the subject. Upon capturing of an image of a subject that is moving at high speed, thus, subject motion information is reflected, and accordingly the image distortion amounts are dissimilar, between images acquired with rolling shutter and images acquired with global shutter.

<Circuit Diagram and Operation Flow: First Pixels=Rolling Shutter>

Figure 5:
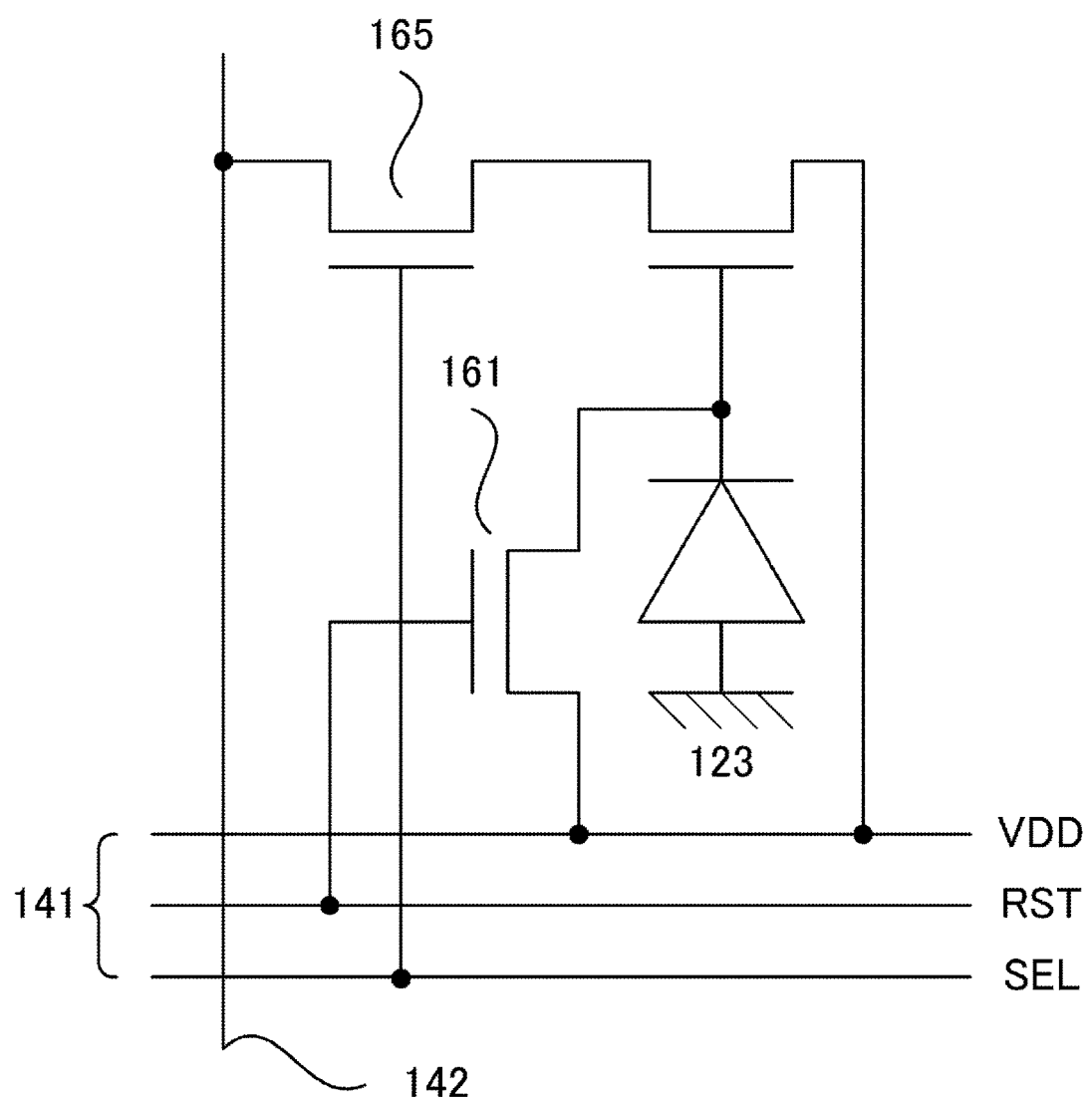
FIG. 5 illustrates a circuit diagram of a first pixel in a solid-state image sensor described in Embodiment 1.
Figure 6:
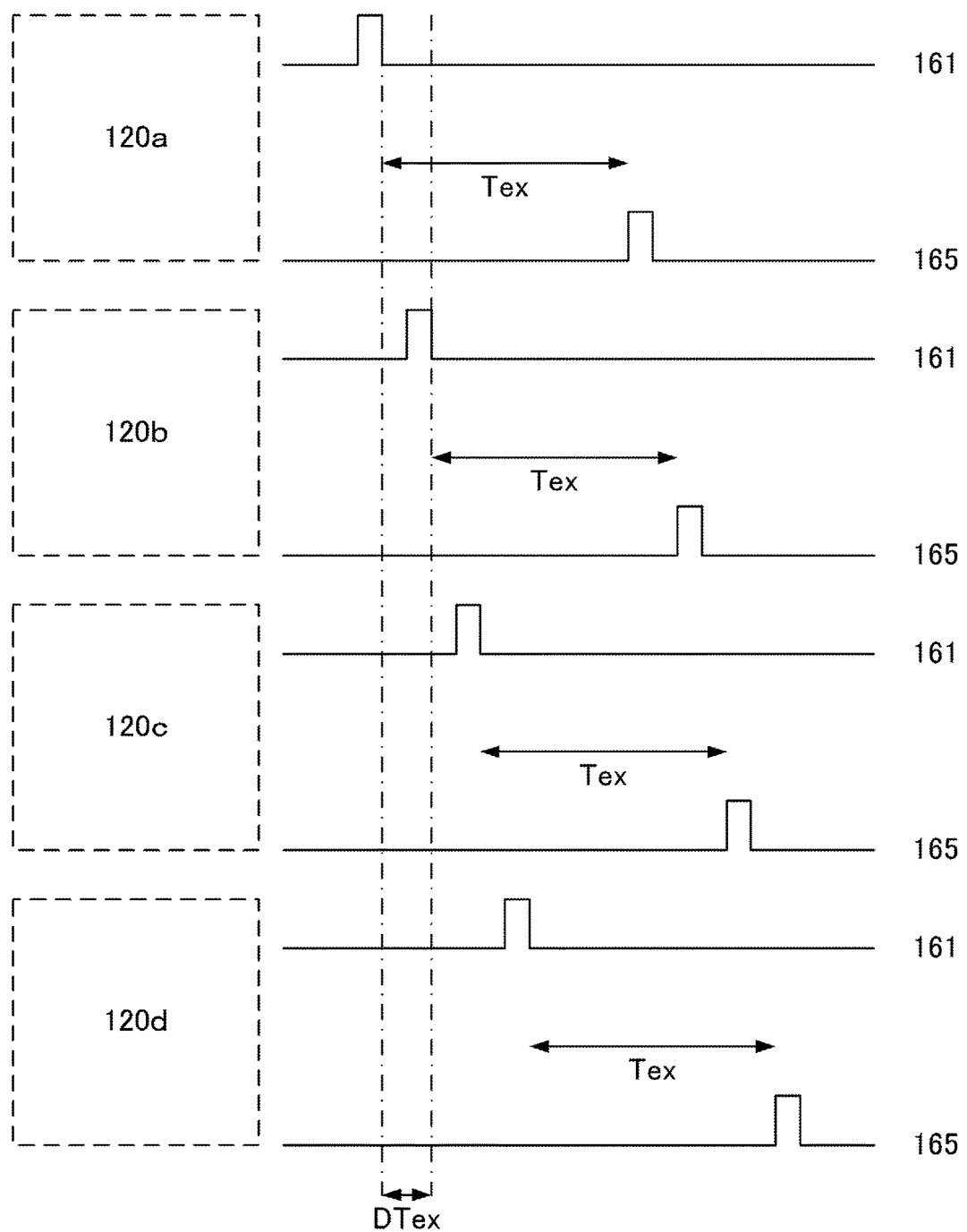
FIG. 6 illustrates an operation flow of first pixels in a solid-state image sensor described in Embodiment 1.
Figure 7:
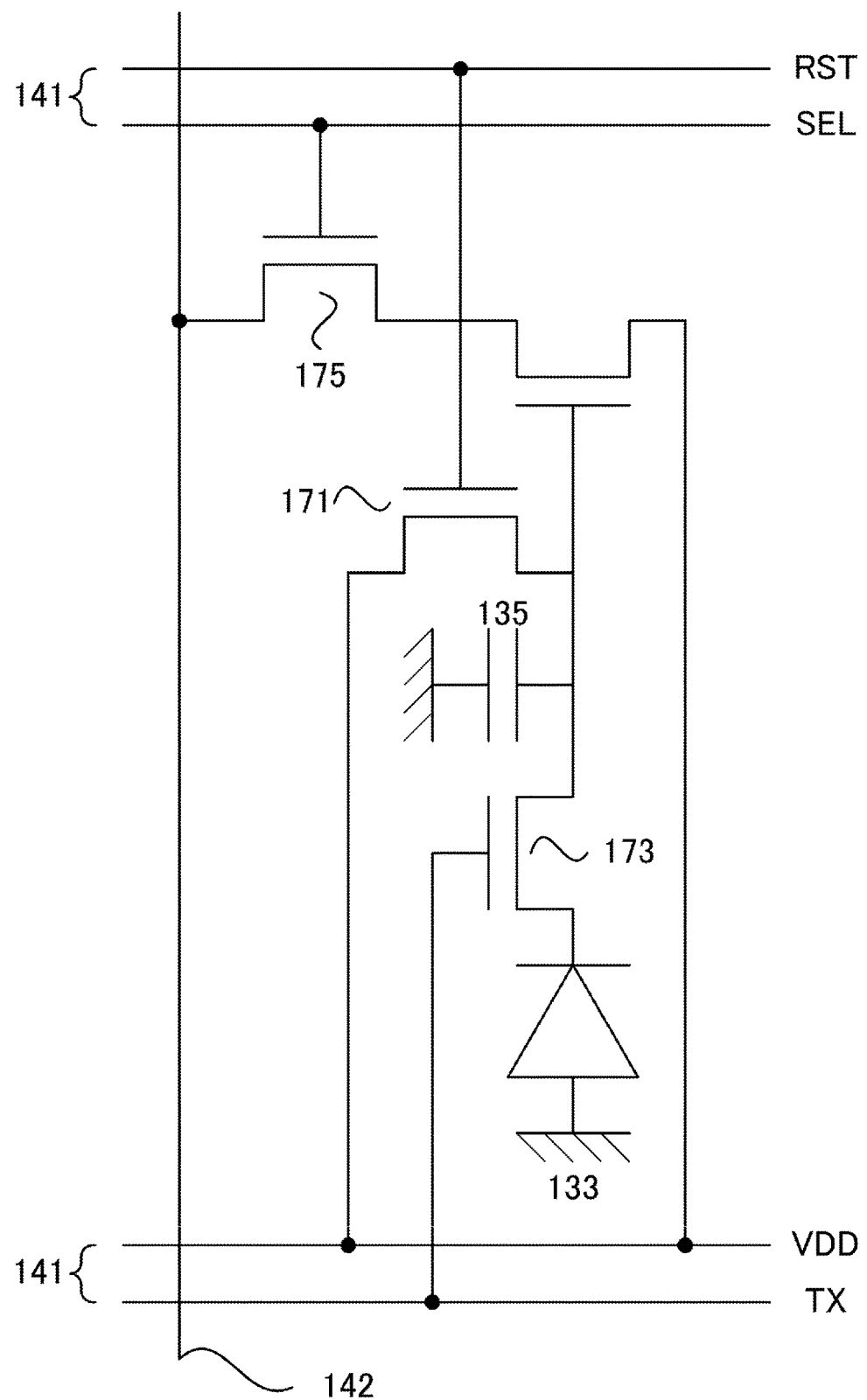
FIG. 7 illustrates a circuit diagram of a second pixel in a solid-state image sensor described in Embodiment 1.
Figure 8:
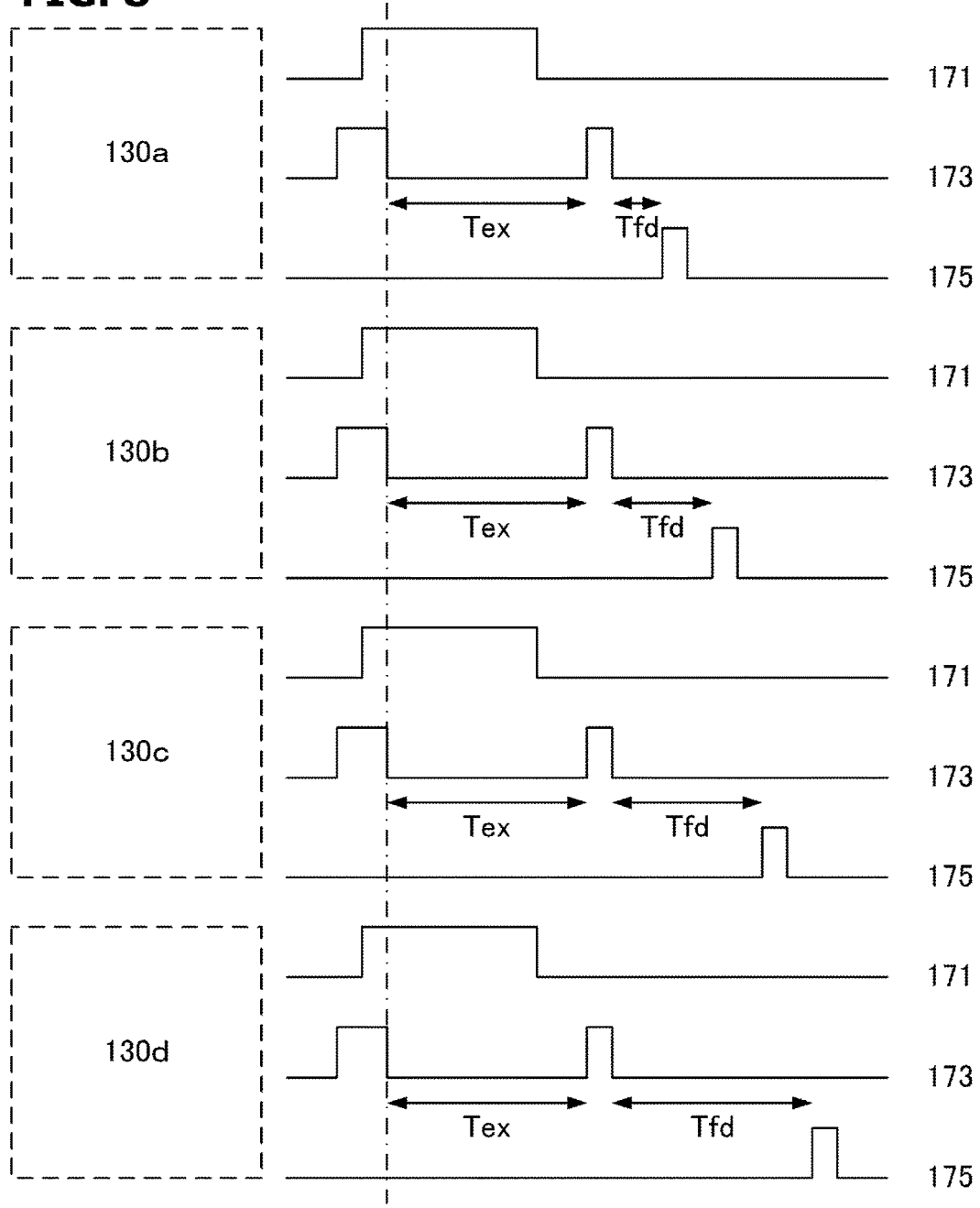
FIG. 8 illustrates an operation flow of second pixels in a solid-state image sensor described in Embodiment 1.

An explanation follows next on the operation of detecting pixel signals in the pixels 120, 130. FIG. 5 is a circuit diagram of a pixel 120, and FIG. 6 is a diagram for explaining the operation flow of a plurality of pixels 120 that are lined up in a same column. Similarly, FIG. 7 is a circuit diagram of a pixel 130, and FIG. 8 is a diagram for explaining the operation flow of a plurality of pixels 130 that are lined up in a same column.

The signal detection operation of the pixels 120 will be explained with reference to FIG. 5 and FIG. 6. Firstly, reset transistors (RSTs) 161 are turned on by the horizontal driving lines 141, sequentially from the top row of the solid-state image sensor 110, to reset the photoelectric conversion unit 123 to a power source voltage (VDD). Next, the RST 161 is similarly turned off, sequentially from the top row of the solid-state image sensor 110, to start charge accumulation in the photoelectric conversion unit 123. The charge accumulated in the photoelectric conversion unit 123 is outputted, in the form of a voltage signal, by a source follower from an amplification transistor that is connected to the photoelectric conversion unit 123. Lastly, select transistors (SELs) 165 are turned on by the horizontal driving lines 141, sequentially from the top row of the solid-state image sensor 110, whereupon pixel signals are transferred to the peripheral circuit by the vertical signal lines 142. In the pixels 120, thus, a lapse of time Tex since the RSTs are turned off until the SELs are turned on constitutes the exposure time. As FIG. 6 illustrates, the exposure timing in the pixels 120 (first pixels) is offset by DTex between adjacent rows, and signal detection is performed with rolling shutter.

<Circuit Diagram and Operation Flow: Second Pixel=Global Shutter>

The signal detection operation of the pixels 130 will be explained with reference to FIG. 7 and FIG. 8. Firstly, a reset transistor (RSTs) 171 and a transfer transistor (TXs) 173 of the ranging pixels 130 are turned on by the horizontal driving lines 141. As a result, the photoelectric conversion unit 133 and the in-pixel memory 135 are reset to the power source voltage (VDD). Next, the TXs 173 in different rows are turned off simultaneously, to start charge accumulation in the photoelectric conversion units 133. After the RSTs 171 are turned off, the TXs 173 of different rows are turned on simultaneously, to transfer the respective charge in the photoelectric conversion units 133 to the in-pixel memories 135. After transfer, the TXs 173 are turned off, thereby to separate the respective photoelectric conversion units and in-pixel memories, and hold charge in the in-pixel memories 135. The charge held in the in-pixel memories 135 is outputted, as a voltage signal, by a source follower from an amplification transistor connected to the in-pixel memories. Lastly, select transistors (SELs) 175 are turned on by the horizontal driving lines 141, sequentially from the top row of the solid-state image sensor 110, whereupon pixel signals are transferred to the peripheral circuit by the vertical signal lines 142. In the ranging pixels 130, thus, a lapse of time Tex since the TXs are turned off until the TXs are turned on constitutes the exposure time. As FIG. 8 illustrates, a respective charge retention time Tfd in each in-pixel memory is set to a predetermined time, such that exposure times are rendered simultaneous. The charge retention time Tfd in each row can be determined on the basis of a reading (transfer) timing set beforehand and an exposure time Tfd set beforehand for each row, and on the basis of the exposure timing. Signals can be read sequentially at each row, while making the exposure timing simultaneous, by setting such a charge retention time for each row. That is, signal detection in the pixels 130 (second pixels) is performed with global shutter.

<Detection of Motion Information Using Image Distortion>

In the pixels 120, thus, a direct signal is transferred by the photoelectric conversion unit 123, and in the pixels 130 a signal is transferred after holding of charge in the in-pixel memory 135. That is, the offset amounts in exposure timings in each row are dissimilar between the pixels 120 and the pixels 130. Accordingly, it becomes possible to acquire, within one same frame, images having different distortion amounts, in the pixels 120 and the pixels 130. Therefore, subject motion information can be acquired, with high precision, by comparing the distortion amounts of both pixels.

Specifically, it suffices that the below-described operation be performed by the processing unit 102. Taking pixels of simultaneous exposure timing as origins (pixels 120a and pixels 130a in FIG. 5 to FIG. 8), the larger the absolute value of the Y coordinate of the pixel, the larger becomes the offset of the on-screen position between an image 139 acquired in the pixels 130 and of an image 129 acquired in the pixels 120. Therefore, the X coordinate of a point P2 on the image 129, corresponding to a point P3 on the image 139, can be written as follows (see FIG. 4), where V denotes the amount of motion of subject in the X direction, Ny denotes the Y coordinate normalized by pixel size, and DTex denotes the exposure timing offset between adjacent rows.

[Math. 1]

$$P2 = P3 + V \times Ny \times \Delta Tex \quad \text{(Expression 1)}$$

That is, the image 129 can be expressed as a function of the parameter V with respect to the image 139. The magnitude of the parameter V corresponds to the magnitude of the image distortion amount on the image. Therefore, the amount of motion of the subject can be worked out by generating a reference image 138 resulting from distorting the standard image 139 while varying the parameter V, and working out, through correlation computation, a value of the parameter V such that a correlation value between the reference image 138 and the comparative image 129 takes on a maximum value.

Herein there may be compared the entirety of the standard image 139 and the comparative image 129, or alternatively, the correlation computation may be performed by cutting out only part of the images. As described above, a larger difference in the absolute values of Y coordinate reflects a larger difference in subject motion between the image 129 and the image 139. Accordingly, the cut-out width in the Y direction is preferably large.

The image 129 may be used as the standard image, and the image 139 may be used as the comparative image. In this case, it suffices to execute the same processing, by describing the image 139 as a function with respect to the image 129, with the amount of motion of the subject as a parameter. The parameter V that denotes the amount of motion may be a motion vector that denotes the amount of translation of the standard image and the comparative image, or may be an affine parameter of high degree of freedom of motion detection, for instance image rotation.

<Number of Pixels 120 and Pixels 130>

In FIG. 2, columns of the pixels 120 and columns of the pixels 130 are disposed alternately, in equal number of pixels, in the column direction. However, any from among the ranging pixels may be disposed in a larger number thereof, or may be disposed not alternately. Preferably, however, the pixels 120 and the pixels 130 are disposed in equal numbers, since in this case the image sizes of the standard image and of the comparative image are identical, and it becomes possible to acquire motion information with high precision. In a case where the numbers of the pixels 120 and the pixels 130 are dissimilar, the amount of motion is calculated after matching of the pixel sizes of the standard image and the comparative image, through skipping of an image acquired with a large number of pixels, or through interpolation of an image acquired with a small number of pixels, or by combining both skipping and interpolation.

<Skipping Reading>

In FIG. 5 to FIG. 8, the pixel signals of all pixels 120, 130 are read, but the signals may be read through skipping of signals of some pixels alone. Power consumption can be reduced by performing skip reading. Preferably, the number of skip rows is set to be larger in the pixels 130 than in the pixels 120. The reasons for this are as follows.

In the case of rolling shutter reading, the distortion amount of the image decreases as the number of skipped pixels increases. Therefore, the distortion amount of the image acquired in the pixels 120 decreases with the number of skip rows of the pixels 120. In the case of global shutter reading, by contrast, the distortion amount of the image does not change, even if the number of skip rows of the pixels is increased.

The larger the distortion amount in the image acquired in the pixels 120 and the image acquired in the pixels 130, the higher becomes the precision with which the motion of the subject can be acquired. Therefore, power consumption can be reduced, while performing high-precision ranging, by skipping the pixels 130, the distortion amount whereof does not change, even with skipping, and not skipping the pixels 120, the distortion amount whereof decreases through skipping. For the reasons given above, it is thus preferable to set the number of skip rows to be larger in the pixels 130 than in the pixels 120.

In a case where rolling shutter reading is performed, as described above the image distortion amount can be modified by varying the number of rows in which pixels are skipped. This feature may be exploited to modify the number of skip rows of pixels, depending on the pixel column, so that, as a result, images are acquired that have different distortion amounts. One such embodiment will be explained in Embodiment 4.

<Expansion of Dynamic Range by Exploiting Differences in Aperture Ratio>

Figure 9:
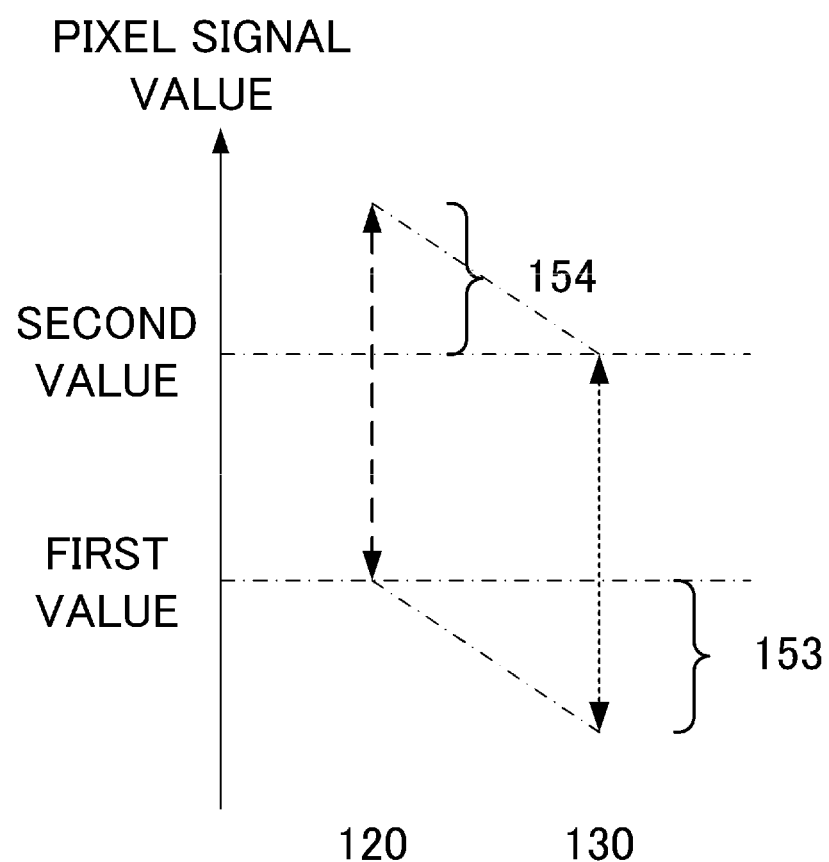
FIG. 9 illustrates signal values acquired in first pixels and second pixels.

As illustrated in FIG. 3, the aperture ratio of the photoelectric conversion unit 123 in the pixels 120 is greater than the aperture ratio of the photoelectric conversion unit 133 in the pixels 130, by the extent that the in-pixel memory 135 is absent in the photoelectric conversion unit 123. Therefore, the dynamic range of images can be expanded by using the pixels 120 for a dark subject, and using the pixels 130 for a bright subject. Upon imaging under identical exposure conditions, the pixel signal value (dashed line) acquired in the pixels 120 is larger than the pixel signal value (dotted line) acquired in the pixels 130, as illustrated in FIG. 9. As a result, the image acquired in the pixels 120, though prone to exhibit blown out highlights at bright portions of the subject, boasts high image quality at dark portions. On the other hand, the image acquired in the pixels 130, though prone to exhibit crushed blacks at dark portions of the subject, boasts high image quality at bright portions.

A high-quality image can therefore be acquired according to the following scheme. In a portion 153 where the pixel signal of the pixels 130 (second pixels) is smaller than a first value, there is used the pixel signal acquired in the pixels 120 (first pixels). On the other hand, in a portion 154 where the pixel signal of the pixels 120 (first pixels) is larger than a second value, there is used the pixel signal acquired in the pixels 130 (second pixels). An image having few blown out highlights or crushed blacks can then be acquired by lastly combining both images. Either pixel signal may be used for portions free of blown out highlights or crushed blacks, whether acquired in the pixels 120 or the pixels 130.

<Reduction of Sensitivity Differences Through Arrangement of Memories at Pixel Boundaries>

Figure 10:
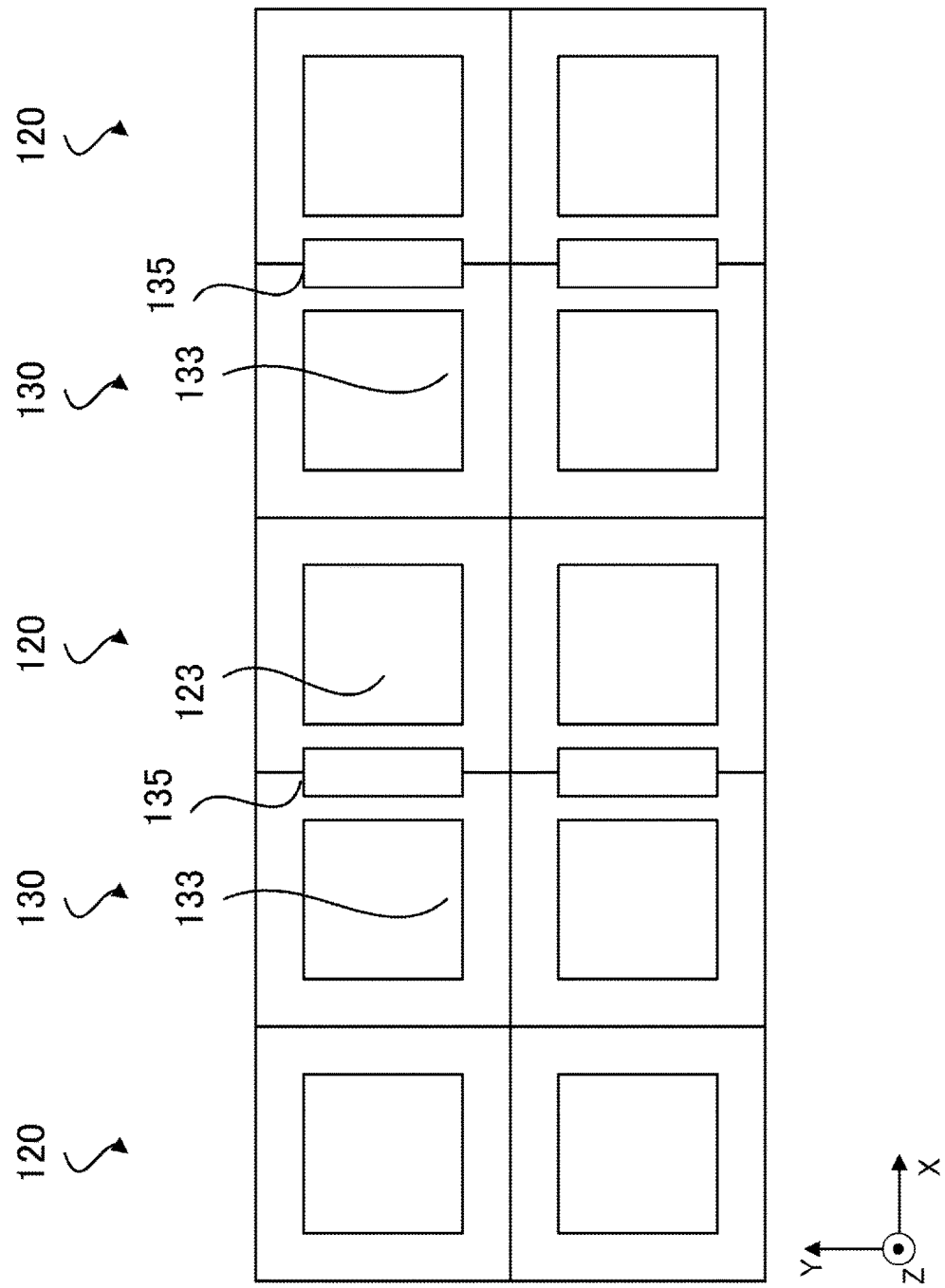
FIG. 10 illustrates a variation of the arrangement of in-pixel memories.

The difference in aperture ratio between the photoelectric conversion unit 123 and the photoelectric conversion unit 133 in adjacent pixels 120 and pixels 130 can be reduced by arranging the in-pixel memories 135 so as to straddle the boundary between the pixels 130 and pixels 120 (FIG. 10). The brightness difference between the image acquired in the pixels 120 and the image acquired in the pixels 130 decreases in a case where such a solid-state image sensor 110 is utilized, and the calculation precision in the calculation of the amount of motion is accordingly enhanced. This is preferable in that the acquisition precision of motion information is likewise enhanced as a result. In a case where such brightness difference exists between the images acquired in the pixels 120 and the pixels 130, the amount of motion is preferably calculated after correction of brightness difference in the processing unit 102.

The pixels 120 and the pixels 130 may have an in-pixel memory for performing correlated double sampling. Herein, correlated double sampling is a technique that involves removing a dark level signal in a circuit by reading beforehand a dark level signal of the in-pixel memory before charge transfer, and taking the difference with respect to the signal after charge transfer.

In this case, the pixels 120 have an in-pixel memory for performing correlated double sampling, and the pixels 130 have the in-pixel memory 135 for performing global shutter and an in-pixel memory for performing correlated double sampling.

<Variations>

FIG. 1 illustrates an example of the motion information acquisition apparatus 100 having the processing unit 102 provided in the interior thereof, but the processing unit 102 need not be provided inside the motion information acquisition apparatus 100. Images of different distortion amounts may be acquired in the motion information acquisition apparatus 100, after which motion information may be acquired on the basis of the distortion amount, using an arithmetic processing unit separate from the motion information acquisition apparatus.

Embodiment 2

A solid-state image sensor 110 described in Embodiment 2 differs from the solid-state image sensor 110 described in Embodiment 1 as regards the configuration and operation flow of pixels 220 (first pixels) that perform signal detection by rolling shutter.

FIG. 11 is a diagram illustrating the pixel internal configuration of a first pixel 220 in the solid-state image sensor 110. The pixels 220 have the same configuration as that of the second pixels 130, and each have a micro-lens 221, and a photoelectric conversion unit 223 and an in-pixel memory 225 provided inside a substrate 222. The circuit configuration of the pixels 220 is identical to that of the pixels 130. The time over which charge is held in the in-pixel memory 225 is different from the time over which charge is held in the in-pixel memory 135. Accordingly, the offset amount in exposure timings in each row is dissimilar between the pixels 220 and the pixels 130. As a result, the image distortion amounts are different in images acquired in the pixels 220 and images acquired in the pixels 130, and, accordingly, subject motion information can be acquired on the basis of differences in distortion amount.

Figure 12:
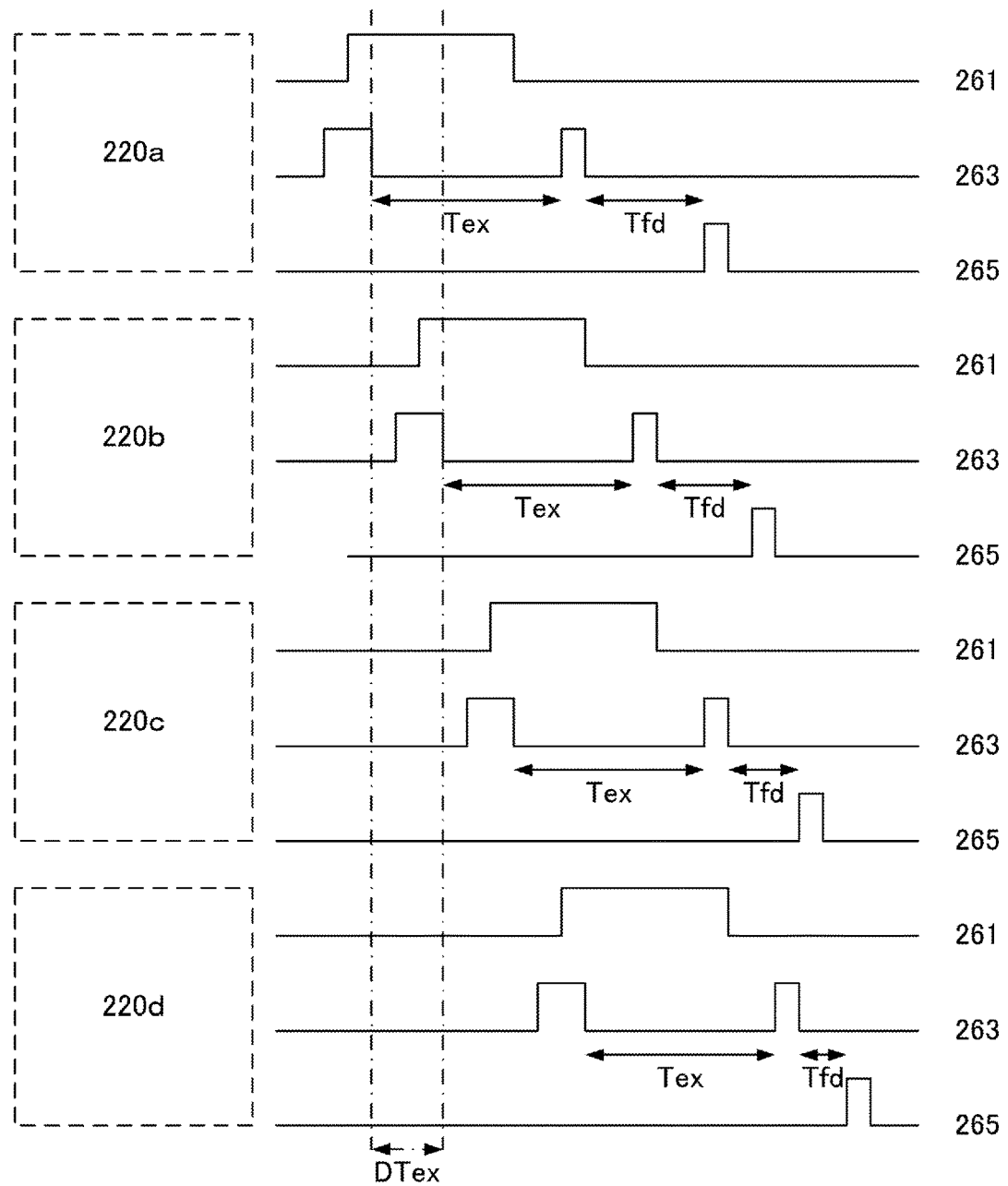
FIG. 12 illustrates an operation flow of first pixels in a solid-state image sensor described in Embodiment 2.

The operation flow of the pixels 220 will be explained with reference to the operation flow of FIG. 12. As illustrated in FIG. 12, the pixels are referred to as pixel 220a, pixel 220b, pixel 220c and pixel 220d, in accordance with the row in which the pixels 220 are disposed. The basic transistor operation is identical to that of the pixels 130 illustrated in FIG. 7, and a detailed explanation thereof will be omitted. Firstly, the photoelectric conversion units 223 and the in-pixel memories 225 are reset using RSTs 261 and TXs 263. Next, transfer transistors 263 in a different row are turned off, with a greater delay the lower the row is, to thereby start charge accumulation in the photoelectric conversion units 223. Next, after the RSTs 261 have been turned off, the TXs 263 are turned on, to thereby transfer the respective charge in the photoelectric conversion units 223 to the in-pixel memories 225. After transfer, the TXs 263 are turned off, thereby to separate the photoelectric conversion units 223 and in-pixel memories 225, and hold charge in the in-pixel memories 225. Lastly, SELs 265 are turned on, from the top row of the solid-state image sensor 110, to transfer thereby sequentially pixel signals to the peripheral circuit.

Although charge is temporarily held in the in-pixel memories of the pixels 220, exposure timings in the pixels 220 of different rows are not simultaneous, as illustrated in FIG. 12. By contrast, the exposure timings in pixels 130 of different rows are identical, as illustrated in FIG. 7. Therefore, it becomes possible to acquire images having different distortion amounts, in the pixels 130 and the pixels 220. To work out motion information on the basis of images having different distortion amounts, it suffices to generate a reference image using Expression 1 and to work out the parameter V by correlation computation, as explained in Embodiment 1.

Thus, motion information can be acquired if the offset amounts of exposure timing between adjacent rows are different from those of the second pixels 130, even when the first pixels 220 have in-pixel memories for holding charge temporarily. The distortion amount of the images acquired in the first pixels can be modified by providing an in-pixel memory also in the first pixels 220, and by controlling the charge retention time Tfd.

<Charge Retention Time in the First Pixels>

For instance, the image distortion amount can be increased with respect to that of the pixels 120 described in Embodiment 1 by setting the charge retention time Tfd to be more prolonged the higher the row at which the pixels 220 are positioned, as illustrated in FIG. 12. The difference in distortion amounts between images acquired in the first pixels and images acquired in the second pixels is made thus larger, which is preferable since motion information can be acquired thereby with high precision. From the viewpoint of power consumption and ease of manufacture, however, the solid-state image sensor described in Embodiment 1 is preferable, since the structure and operation of the first pixels are simpler in the latter.

<Charge Retention Time in the Second Pixels>

Figure 13:
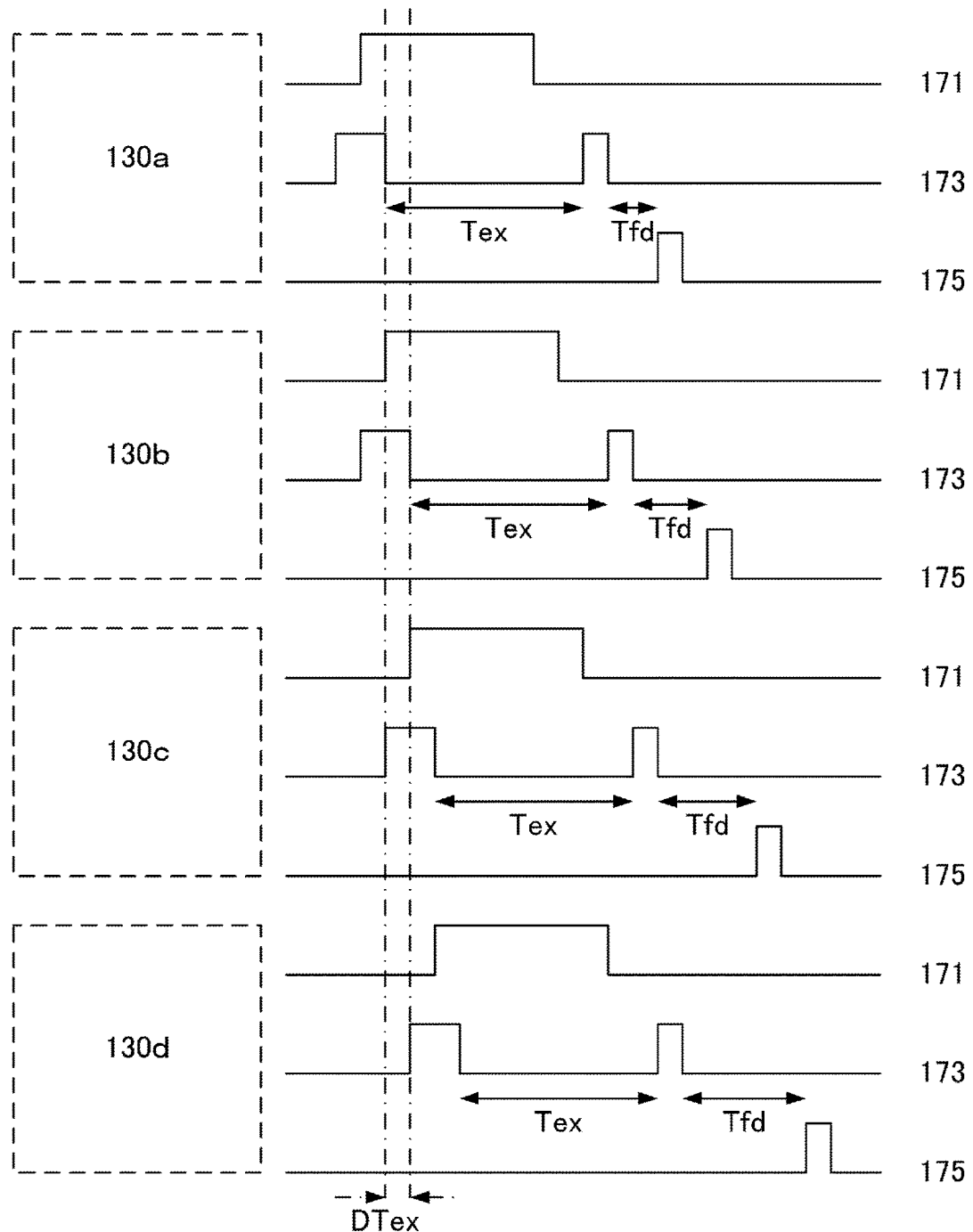
FIG. 13 illustrates a variation of the operation flow of second pixels in a solid-state image sensor.

There is no need to necessarily utilize global shutter, of making the exposure timing simultaneous in different rows, in the second pixels 130 as well. Motion information can be acquired so long as the offset amount in exposure timings of second pixels 130 in adjacent rows and the offset amount in exposure timing of first pixels 220 in adjacent row are different from each other. FIG. 13 illustrates an example of the operation of the second pixels 130. Motion information can be acquired if the difference in charge retention time in the in-pixel memories of the second pixels 130, in each row, as illustrated in FIG. 13, is different from the difference in charge retention times in the in-pixel memories of the first pixels 220, in each row. A distortion-free image can be generated using the difference in the distortion amount of images acquired in the first pixels and images acquired in the second pixels, also when the second pixels do not operate with global shutter.

For the same reason, the second pixels need not operate with global shutter also in the solid-state image sensor 110 of Embodiment 1. Motion information can be acquired if the difference in charge retention time in the in-pixel memories of the second pixels 130, in each row, is different from the difference in charge retention times in the in-pixel memories of the first pixels 120, in each row.

As described above, a large difference in the distortion amount between images acquired in the first pixels and images acquired in the second pixels makes it possible to acquire motion information with high precision. Preferably, therefore, the exposure timings of different rows are exactly the same, by resorting to global shutter, in the second pixels.

As in the case of Embodiment 1, the first pixels 220 and the second pixels 130 may have an in-pixel memory for performing correlated double sampling. In this case, both the first pixels 220 and the second pixels 130 have a memory for correlated double sampling, in addition to a memory for controlling the offset amount in exposure timing between adjacent rows.

Embodiment 3

In a solid-state image sensor 110 described in Embodiment 3, the pixels in the solid-state image sensor 110 have also a ranging function, such that the pixels can acquire both subject motion information and, simultaneously, distance information. By adopting the above configuration, it becomes possible to acquire subject distance information simultaneously with subject motion information. The amount of motion of the subject on the image plane can be converted to amount of motion of the subject in real space, by using subject distance information at the same time. This is more preferable since the speed of the subject can then be acquired as a result.

Figure 14A:
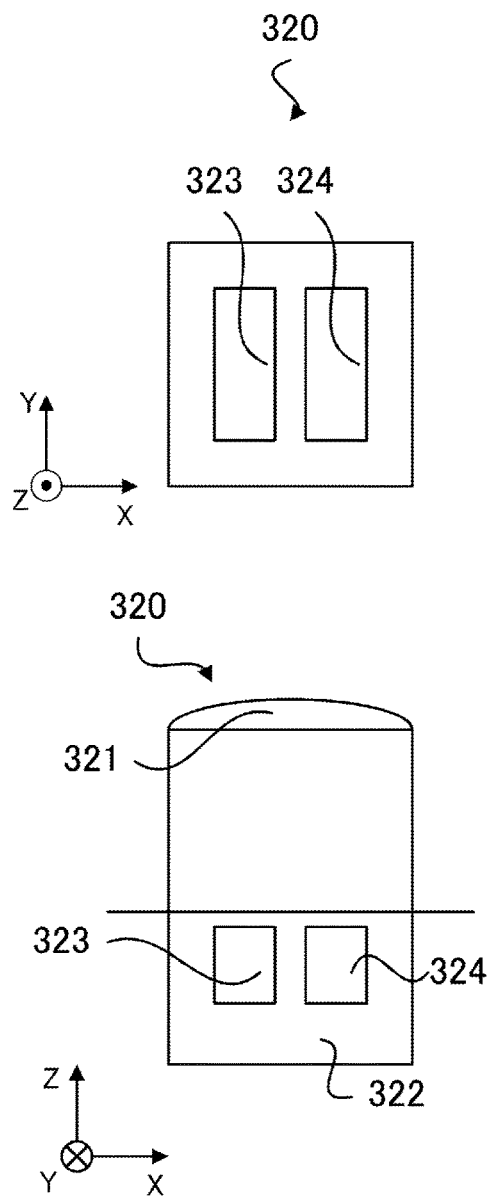
FIGS. 14A, 14B illustrate pixels in a solid-state image sensor described in Embodiment 3.
Figure 14B:
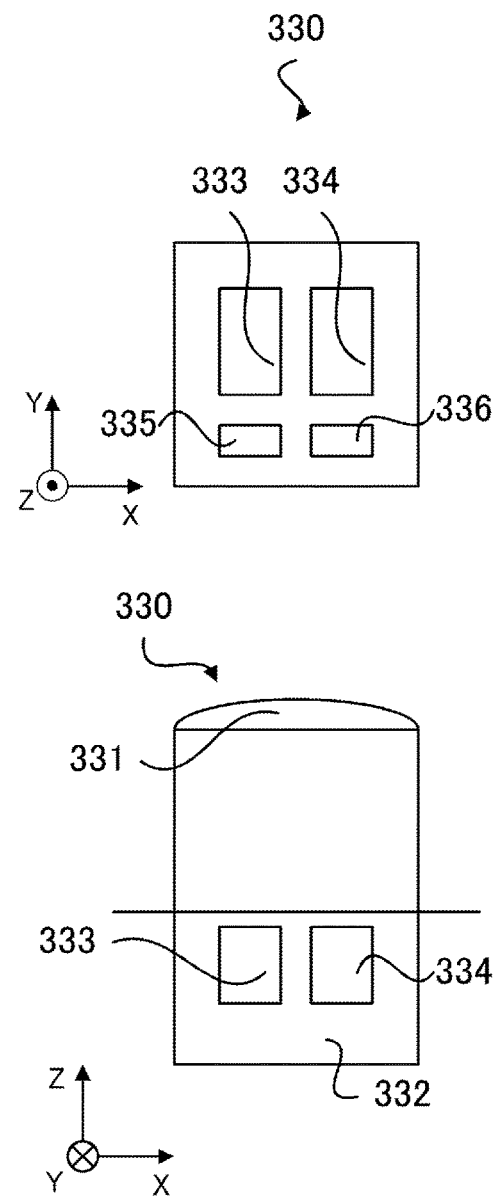

FIG. 14(a) is a schematic diagram illustrating a pixel internal configuration of ranging pixels 320 (first pixels), and FIG. 14(b) is a schematic diagram illustrating the pixel internal configuration of ranging pixels 330 (second pixels). In the ranging pixels 320 (330), two photoelectric conversion unit 323 (333) and 324 (334) are formed in the substrate 322 (332), lined up in the X direction, and a micro-lens 321 (331) is disposed astride the two photoelectric conversion units. Within an exit pupil of the imaging optical system, a light beam that is incident from a pupil region, eccentric in the +X direction, is selectively guided to the photoelectric conversion unit 323 (333), and a light beam that is incident through a pupil region eccentric in the −X direction is selectively guided to the photoelectric conversion unit 324 (334). Distance can be detected, through triangulation according to a stereo image, by comparing the offset amounts of images acquired in the two photoelectric conversion units. Adding the signals acquired in the two photoelectric conversion units allows acquiring a light beam having passed through the entire pupil region of the imaging optical system, and allows simultaneously acquiring image information in the ranging pixels.

An in-pixel memory 335 corresponding to the photoelectric conversion unit 333 and an in-pixel memory 336 corresponding to the photoelectric conversion unit 334 are provided in each of the ranging pixels 330 (second pixels), such that pixel signals are acquired with global shutter, through temporary holding of charge in the in-pixel memory. By contrast, no in-pixel memories are provided in the ranging pixels 320 (first pixels), and pixel signals are acquired by rolling shutter.

<Operation Flow of Pixels>

Figure 15:
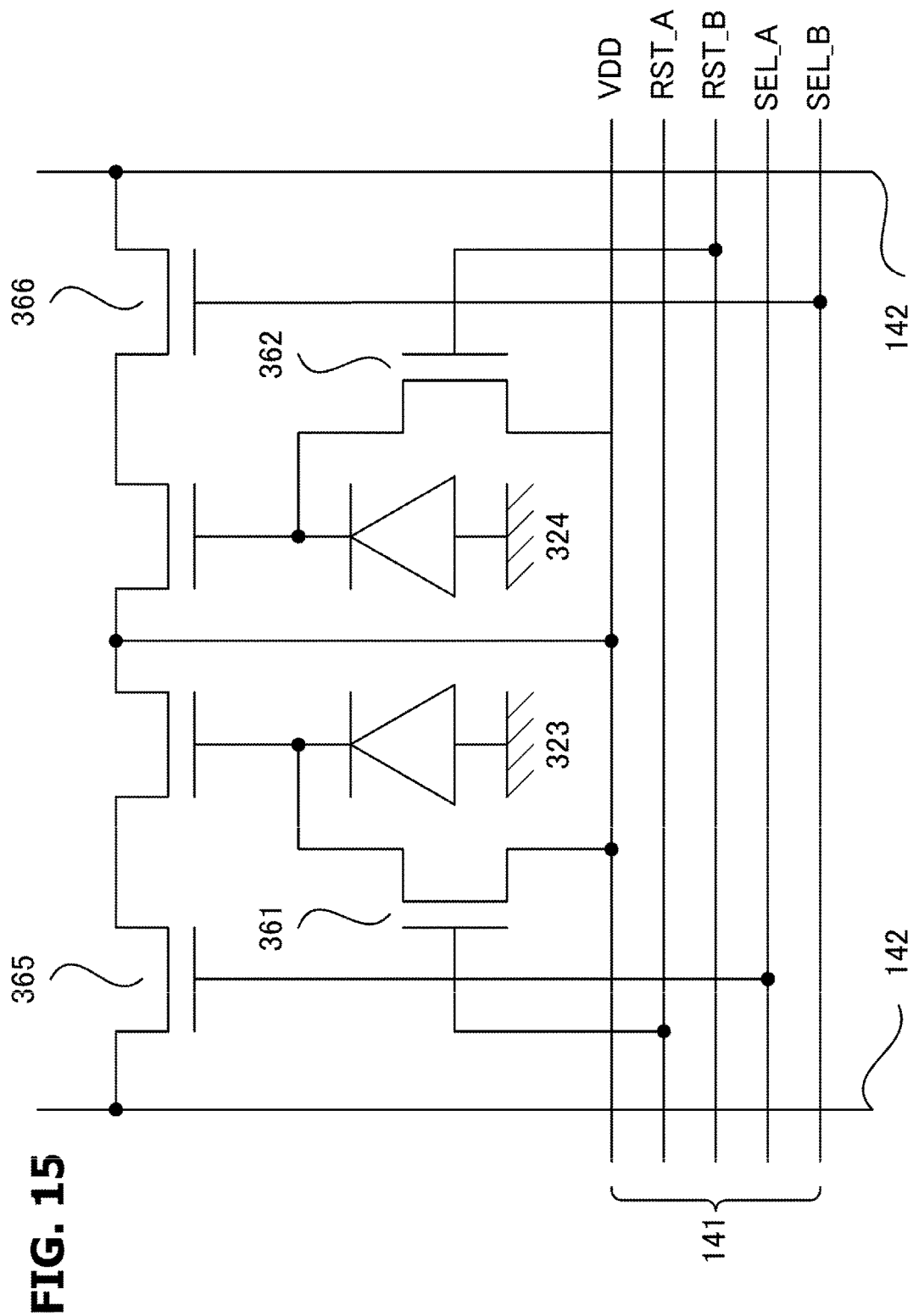
FIG. 15 illustrates a circuit diagram of a first pixel in a solid-state image sensor described in Embodiment 3.
Figure 16:
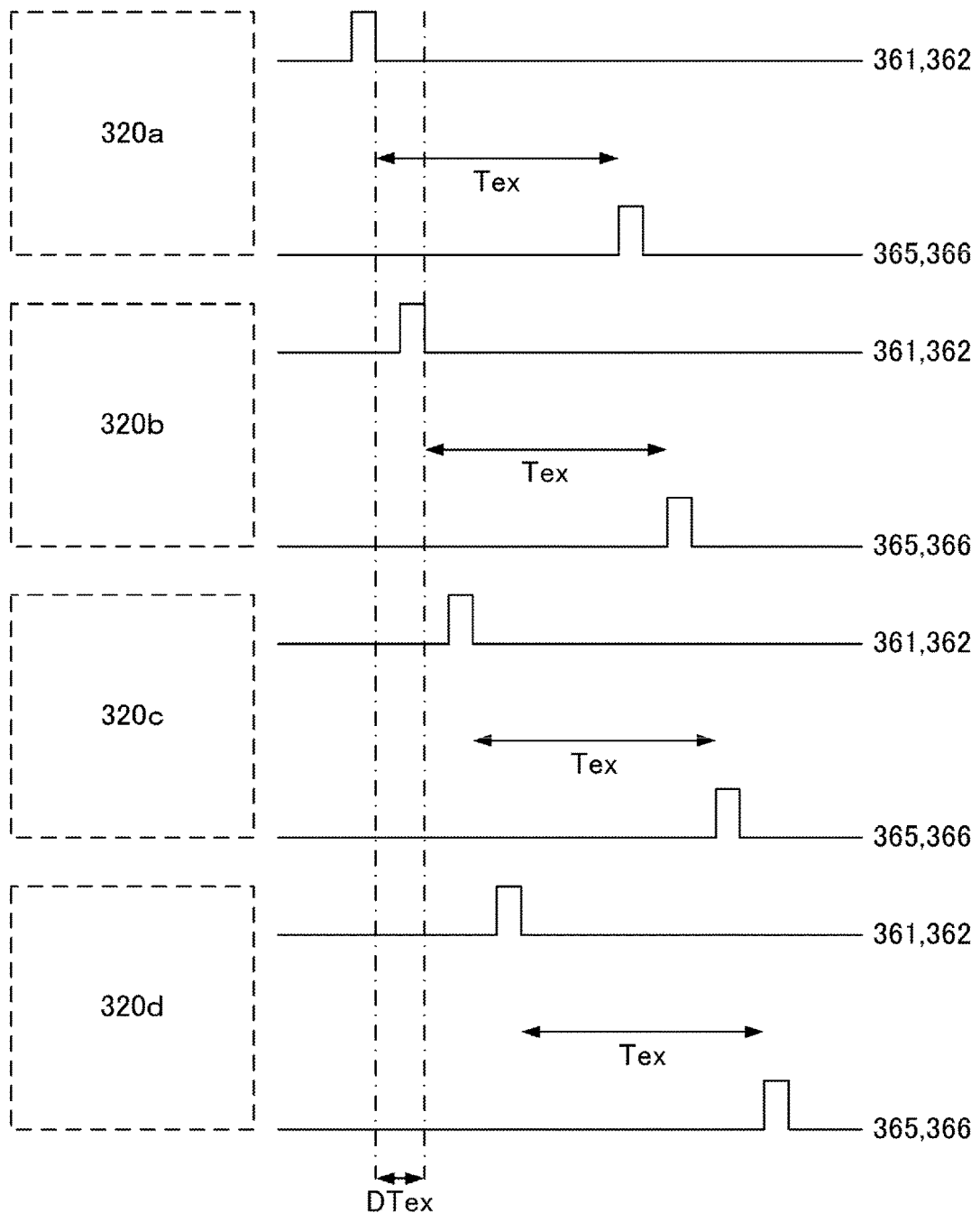
FIG. 16 illustrates an operation flow of first pixels in a solid-state image sensor described in Embodiment 3.

The signal detection operation of the ranging pixels 320 will be explained with reference to FIG. 15 and FIG. 16. FIG. 15 is a circuit diagram of a ranging pixel 320, and FIG. 16 is a diagram for explaining the operation flow of a plurality of ranging pixels 320 that are lined up in a same column. As illustrated in FIG. 16, the pixels are referred to as pixel 320a, pixel 320b, pixel 320c and pixel 320d, in accordance with the row in which the pixels 320 are disposed. Firstly, reset transistors (RSTs) 361, 362 are switched on, sequentially from the top row of the solid-state image sensor 110, to reset the photoelectric conversion units 323, 324. Next, the RSTs 361, 362 are similarly turned off, sequentially from the top row of the solid-state image sensor 110, to start charge accumulation in the photoelectric conversion units 323, 324. Lastly, select transistors (SELs) 365, 366 are turned on, sequentially from the top row of the solid-state image sensor 110, to transfer pixel signals to the peripheral circuit. As FIG. 16 illustrates, the exposure timing in the ranging pixels 320 (first pixels) is offset by DTex for each row, and signal detection is performed with rolling shutter.

Figure 17:
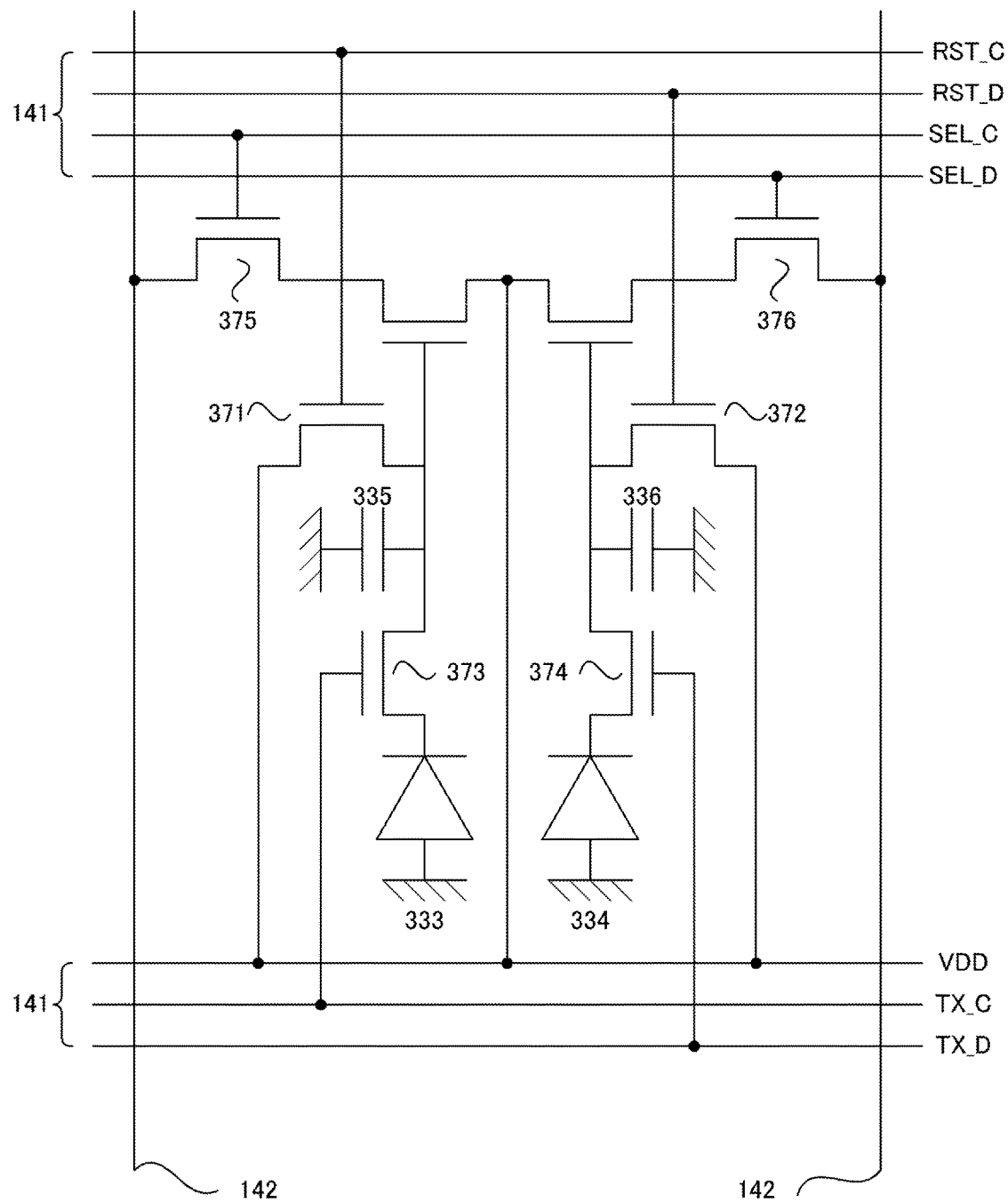
FIG. 17 illustrates a circuit diagram of a second pixel in a solid-state image sensor described in Embodiment 3.

The signal detection operation of the ranging pixels 330 will be explained with reference to FIG. 17 and FIG. 18. FIG. 17 is a circuit diagram of a ranging pixel 330, and FIG. 18 is a diagram for explaining the operation flow of a plurality of ranging pixels 330 that are lined up in a same column. Firstly, reset transistors (RSTs) 371, 372 and transfer transistors (TXs) 373, 374 are turned on, to reset the photoelectric conversion units 333, 334 and in-pixel memories 335, 336. Next, the TXs 373, 374 in different rows are turned off simultaneously, to start charge accumulation in the photoelectric conversion units 333, 334. After the RSTs 371, 372 have been turned off, the TXs 373, 374 of different rows are turned on simultaneously, to transfer the respective charge in the photoelectric conversion units 333, 334 to the in-pixel memories 335, 336. After transfer, the TXs 373, 374 are turned off, thereby to separate the photoelectric conversion units and in-pixel memories, and hold charge in the in-pixel memories 335, 336. Lastly, select transistors (SELs) 375, 376 are turned on, sequentially from the top row of the solid-state image sensor 110, to transfer pixel signals to the peripheral circuit. As FIG. 18 illustrates, the exposure timings of the ranging pixels 330 (second pixels) in different rows are simultaneous, and signals are detected with global shutter.

<Selection of Ranging Pixels to be Used>

The ranging pixels 320 and the ranging pixels 330 both can acquire subject distance information, and, accordingly, subject distance information may be acquired using either the ranging pixels 320 or the ranging pixels 330, although distance information of yet higher precision can be acquired by comparing the results of the two. High-precision ranging regardless of the subject can be achieved herein by modifying the ranging pixels that are used, depending on the subject. Relevant examples are illustrated below.

The aperture ratio of the photoelectric conversion units 323, 324 in the ranging pixels 320 is larger than that of the photoelectric conversion units 333, 334 in the ranging pixels 330, by the extent that the in-pixel memories 335, 336 are not provided in the photoelectric conversion units 323, 324. Therefore, high-precision distance information can be acquired by performing ranging using the ranging pixels 320 of high sensitivity, for a dark subject.

Exposure timings are offset between different rows in a case where images of a subject that is moving at high speed are acquired using rolling shutter, as described above. Preferably, therefore, ranging for a subject that is moving at high speed is performed using the ranging pixels 330 that utilize global shutter.

Preferably, the configurations of the ranging pixels 320 and the ranging pixels 330 are modified, to allow thereby high-precision distance information to be acquired, regardless of the subject. Relevant examples are illustrated below.

<Base Line Length of the Ranging Pixels>

In FIG. 14, the base line lengths of the ranging pixels 320 and the ranging pixels 330 are identical, but the base line lengths of the ranging pixels 320 and the ranging pixels 330 may be set to different. The base line length increases as there increases the number of ranging pixels that receive selectively a light beam from the outer pupil region, within the exit pupil of the imaging optical system; accordingly, ranging of yet higher precision can be performed as a result. The greater the number of pixels that selectively receive a light beam from the outer pupil region, the greater is the reduction in the amount of light received from the central pupil region and, accordingly, the greater is the drop in sensitivity. There is thus a trade-off between base line length and sensitivity.

In this case, preferably, the first pixels having no in-pixel memories are configured to selectively receive a light beam from the outer pupil region and the second pixels having an in-pixel memory are configured to receive also a light beam from an inner pupil region. The reasons for this are as follows.

As described above, a small brightness difference between the first pixels and the second pixel allows acquiring high-precision subject motion information. In the ranging pixels 320 and ranging pixels 330 illustrated in FIG. 14, the ranging pixels 320 have no in-pixel memory, and hence the aperture ratio of the photoelectric conversion units of the latter is high. Brightness differences between the ranging pixels 320 and the ranging pixels 330 can be reduced by prescribing the ranging pixels 320 of high aperture ratio to receive selectively a light beam from the outer pupil region, and prescribing the ranging pixels 320 of low aperture ratio to receive also a light beam from the central pupil region. Thus, the base line length can be lengthened while reducing brightness difference, and there can be enhanced the ranging precision when the ranging pixels 320 are used.

FIG. 19 illustrates specific configurations. FIG. 19(*a*) is a schematic diagram illustrating a pixel internal configuration of the ranging pixels 320, and FIG. 19(*b*) is a schematic diagram illustrating the pixel internal configuration of the ranging pixels 330. The photoelectric conversion units 323, 324 in the ranging pixels 320 are closer to the periphery of the pixels, in the X direction, so that a light beam can be selectively received as a result from the outer pupil region. By contrast, the photoelectric conversion units 333, 334 in the ranging pixels 330 are closer to the center of the pixels, and hence are therefore configured to be capable of receiving also a light beam from the inner pupil region.

In FIG. 14 the pupil division direction of the ranging pixels 320 and the ranging pixels 330 is the X direction, but the pupil division direction may be the Y direction or an oblique direction. In particular, high-precision ranging is enabled, regardless of a texture direction of the subject, by prescribing different pupil division directions for the ranging pixels 320 and the ranging pixels 330.

<Configuration where Only Some Pixels are Ranging Pixels>

In FIG. 14, an example has been illustrated wherein both the first pixels and the second pixels are ranging pixels having a ranging function, but a configuration is also possible where either the first pixels or the second pixels alone are ranging pixels. A case where the second pixels are set to be ranging pixels is preferable in that the ranging precision for a subject that is moving at high speed is enhanced as a result. A case where first pixels are set to be ranging pixels, on the other hand, is preferable in that the functions of ranging and global shutter are distributed among the first and the second pixels, and as a result sensitivity differences between pixels can be reduced, and manufacturing simplified. It is also possible for just some of the first pixels or some of the second pixels to be ranging pixels.

<Variation of Ranging Pixels>

A plurality of pixels that detects a light beam that passes through part of the pupil of the imaging optical system may be used as ranging pixels, as illustrated in FIG. 21. An imaging pixel 380 illustrated in FIG. 21(*a*), a ranging pixel 381 illustrated in FIG. 21(*b*) and a ranging pixel 311 illustrated in FIG. 21(*c*) each have a micro-lens 312 and a single photoelectric conversion unit 314 disposed within a substrate 313. The ranging pixels 380, 381 each have a light-shielding film 315, between the micro-lens 312 and the substrate 313, such that the light-shielding film 315 is shifted with respect to the optical axis of the micro-lens 312.

By adopting the above configuration, the ranging pixels 380 receive selectively a light beam from the pupil region, in the +X direction, of the imaging optical system, and the ranging pixels 381 receive selectively a light beam from the pupil region in the −X direction, of the imaging optical system. In the image acquired in the ranging pixels 380 and the image acquired in the ranging pixels 381, image shift occurs in the X direction (row direction), and accordingly ranging can be performed by comparing both acquired images.

Imaging pixels 311 that acquire light from the entire pupil region may be used instead of the ranging pixels 380 (381). Signals by light beams from the pupil region in the −X direction (+X direction) can be acquired on the basis of differences between signals acquired in the imaging pixels 311 that receive light from the entire pupil region, and signals acquired by the ranging pixels 380 (381).

Embodiment 4

A solid-state image sensor 110 described in Embodiment 4 acquires images of dissimilar distortion amount by modifying the number of skip rows of pixels depending on the pixel column. Specifically, the distortion amount in images acquired in the second pixels 430*a*, 430*b*, 430*c*, and 430*d* (which are collectively referred to as the second pixel 430) can be made smaller than that of images acquired in the first pixels 420*a*, 420*b*, 420*c*, and 420*d* (which are collectively referred to as the first pixel 420), by setting a greater the number of rows of skipped second pixels 430 than is the case in the first pixels 420. A configuration will be described hereafter where every other row of the pixels 430 is skipped, with no pixels 420 being skipped.

The circuit configuration of both the first pixels 420 and the second pixels 430 is identical to that of the first pixels 120 of Embodiment 1, and pixel signals are acquired with rolling shutter.

Figure 23:
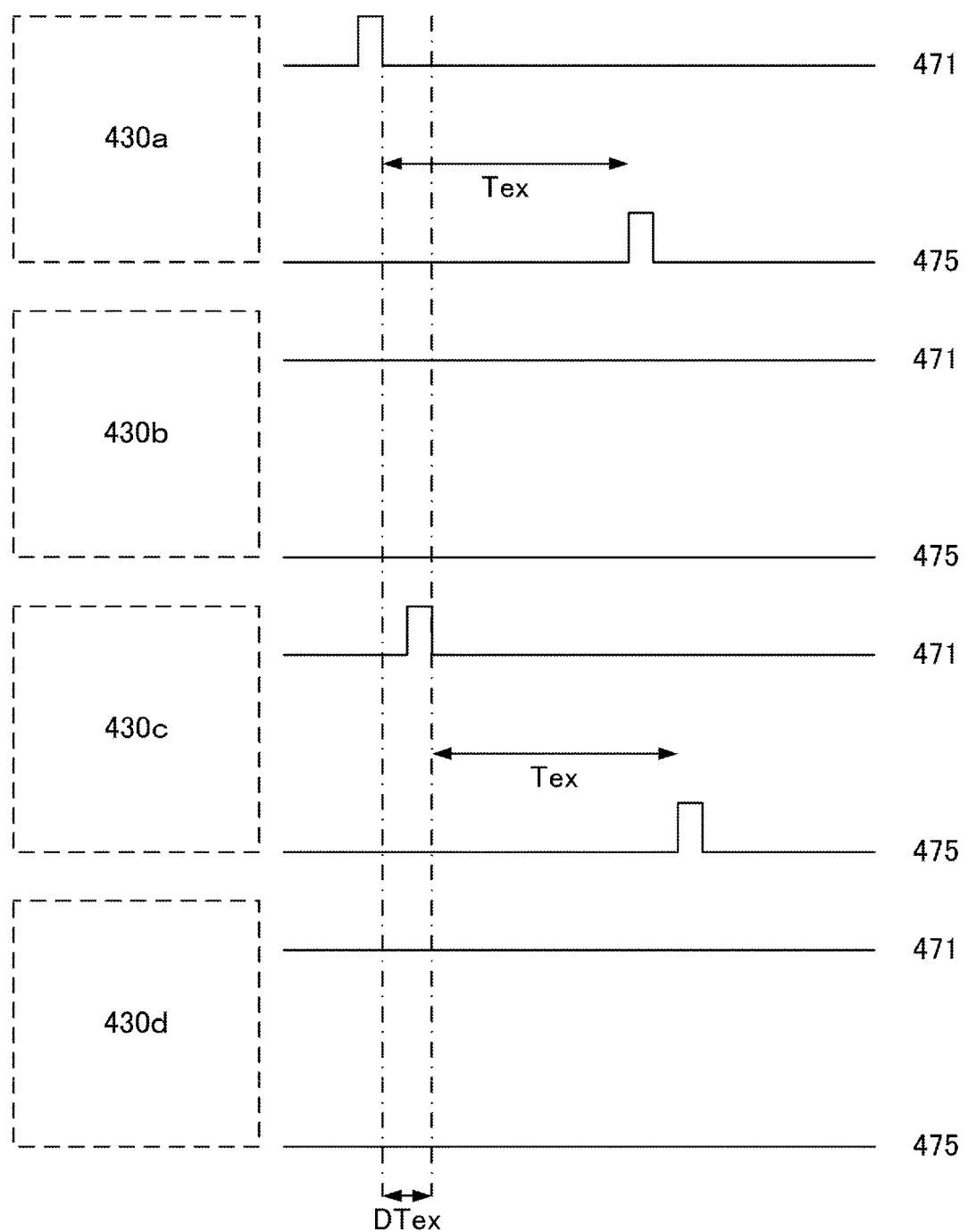
FIG. 23 illustrates an operation flow of second pixels in a solid-state image sensor described in Embodiment 4.

FIG. 22 is a diagram for explaining the operation flow of a plurality of pixels 420 that are lined up in a same column, and FIG. 23 is a diagram for explaining the operation flow of a plurality of pixels 430 that are lined up in a same column. As illustrated in FIG. 22, the pixels are referred to as pixel 420*a*, pixel 420*b*, pixel 420*c* and pixel 420*d*, in accordance with the row in which the pixels 420 are disposed. As illustrated in FIG. 23, the pixels are referred to as pixel 430*a*, pixel 430*b*, pixel 430*c* and pixel 430*d*, in accordance with the row in which the pixels 430 are disposed. As in FIG. 6, the exposure time Tex lasts since reset transistors 461, 471 are turned off until select transistors 465, 475 are turned on.

In the pixels 420, the exposure timing differs by an increment DTex per row, as illustrated in FIG. 22. In the pixels 430, by contrast, the exposure timing differs by an increment DTex every two rows, as illustrated in FIG. 23. That is, the offset amount in exposure timing of the pixels 430 every two rows is half the offset amount of the exposure timing of the pixels 420. Accordingly, it becomes possible to acquire, within one same frame, images having different distortion amounts, in the pixels 420 and the pixels 430. Therefore, subject motion information can be acquired, with high precision, by comparing the distortion amounts of both pixels. To work out motion information on the basis of images having different distortion amounts, it suffices to generate a reference image using Expression 1 and to work out the parameter V by correlation computation, as explained in Embodiment 1.

However, it is preferable to acquire images of different distortion amount using the in-pixel memories, as in the solid-state image sensors described in Embodiments 1 and 2, than to acquire images of different distortion amount by modifying the number of skip rows, as in the solid-state image sensor 110. The reasons for this are as follows.

In the case of the solid-state image sensor 110, the larger the difference between the number of skip rows of the pixels 430 and the number of skip rows of the pixels 420, the greater can be made the difference in the distortion amounts of the images acquired in the pixels 420 and the images acquired in the pixels 430, and the more can be enhanced the acquisition precision of motion information. On the other hand, the larger the difference in the number of skip rows, the larger becomes the difference in the size of the images acquired in the pixels 420 and the size in the images acquired in the pixels 430, and, accordingly, the greater is the drop in the precision of motion information. A trade-off arises thus in the solid-state image sensor 110, since the distortion amount of images and the number of pixels both vary depending on the number of skip rows.

In Embodiment 1 and Embodiment 2, the size of the pixels is controlled according to the number of pixels of the first pixels and the second pixels, and the distortion amount is controlled according to charge retention time in the in-pixel memories; in consequence, a trade-off such as the one Embodiment 4 does not arise in Embodiments 1 and 2. Preferably, therefore, images of different distortion amount are acquired by controlling the charge retention time in the in-pixel memories.

A subject can be tracked and/or recognized by using the subject motion information acquired by the solid-state image sensor illustrated in the above embodiments. For instance, a method may be carried out where motion information is used to differentiate between an object and the background, for instance through modification of the orientation of a camera, zoom or focus, in accordance with the direction in which a subject is moving.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-013377, filed on Jan. 28, 2014 Japanese Patent Application No. 2014-187752, filed on Sep. 16, 2014, and Japanese Patent Application No. 2014-187753, filed on Sep. 16, 2014 which are hereby incorporated by reference herein in their entirety.

REFERENCE SIGNS LIST

110: Solid-state image sensor
120, 220, 320, 420: First ranging pixel
130, 230, 330, 430: Second ranging pixel
135, 225, 335, 336: In-pixel memory

The invention claimed is:

1. A solid-state image sensor for acquiring respective signals of a plurality of pixels disposed in a matrix in the solid-state image sensor, by sequentially reading the signals in signal lines disposed along a column direction, the solid-state image sensor comprising:
   first pixels that are disposed in columns of the matrix; and
   second pixels having in-pixel memories and disposed in columns of the matrix different from those of the first pixels,
   wherein a difference in exposure timings of the second pixels between adjacent rows of the matrix is caused to be different from a difference in exposure timings of the first pixels between adjacent rows of the matrix, by reading signals from the second pixels after holding the signals in the in-pixel memories for a predetermined charge retention time,
   wherein an aperture ratio of photoelectric conversion units of the first pixels is larger than an aperture ratio of photoelectric conversion units of the second pixels,
   wherein the first pixels are first ranging pixels and the second pixels are second ranging pixels, and
   wherein image information is generated by selecting image information acquired in the first ranging pixels in a case where a value of the signals acquired in the second ranging pixels is smaller than a first value and by selecting image information acquired in the second ranging pixels in a case where a value of the signals acquired in the first ranging pixels is larger than a second value, the second value being greater than the first value.

2. The solid-state image sensor according to claim 1, wherein a number of the first pixels is identical to a number of the second pixels.

3. The solid-state image sensor according to claim 1, wherein the first pixels have no in-pixel memory.

4. The solid-state image sensor according to claim 1, wherein the first pixels have an in-pixel memory, and
   wherein the difference in exposure timings of the second pixels between adjacent rows of the matrix is caused to be different from the difference in exposure timings of the first pixels between adjacent rows of the matrix by causing a charge retention time in the in-pixel memories of the first pixels to be different from the charge retention time in the in-pixel memories of the second pixels.

5. The solid-state image sensor according to claim 4, wherein a charge retention time for the in-pixel memories is longer for the first pixels from which signals are read earlier in the signal lines, than for the first pixels which are read later in the signal lines.

6. The solid-state image sensor according to claim 1, wherein the exposure timings of the second pixels between adjacent rows of the matrix are simultaneous.

7. The solid-state image sensor according to claim 1, wherein the in-pixel memories of the second pixels are disposed so as to straddle boundaries of adjacent first pixels and second pixels.

8. The solid-state image sensor according to claim 1, wherein the solid-state image sensor is configured in such a manner that signals are read from the first pixels and the second pixels by skipping a predetermined number of rows, and wherein the number of skip rows of the second pixels is greater than the number of skip rows of the first pixels.

9. A motion information acquisition apparatus, comprising:

the solid-state image sensor according to claim 1; and a processing unit that acquires subject motion information by difference comparison between a distortion amount of an image acquired in the first pixels and a distortion amount of an image acquired in the second pixels, in a same frame.

10. The motion information acquisition apparatus according to claim 9, wherein the processing unit uses an image acquired in the first pixels and an image acquired in the second pixels to generate a distortion-free image in the processing unit.

11. The motion information acquisition apparatus according to claim 9, wherein at least some pixels from among the first pixels or the second pixels are ranging pixels that separate and detect a light beam that strikes the solid-state image sensor, and wherein the processing unit acquires the speed of a subject by using subject distance information and subject motion information determined from an image acquired in the ranging pixels.

12. An imaging apparatus, comprising the solid-state image sensor according to claim 1.

* * * * *